(12) United States Patent
Takahashi et al.

(10) Patent No.: US 7,759,177 B2
(45) Date of Patent: Jul. 20, 2010

(54) MANUFACTURING METHOD OF SEMICONDUCTOR DEVICE

(75) Inventors: Hidekazu Takahashi, Kanagawa (JP); Eiji Sugiyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 858 days.

(21) Appl. No.: 11/500,717

(22) Filed: Aug. 8, 2006

(65) Prior Publication Data

US 2007/0037337 A1    Feb. 15, 2007

(30) Foreign Application Priority Data

Aug. 12, 2005   (JP)   .............................. 2005-235017

(51) Int. Cl.
*H01L 21/84* (2006.01)
(52) U.S. Cl. ....................... 438/151; 438/585; 438/610; 438/662; 257/E21.415
(58) Field of Classification Search ................. 438/585, 438/610, 613, 661, 662, 151; 257/E21.415
See application file for complete search history.

(56) References Cited

U.S. PATENT DOCUMENTS

| | | | | |
|---|---|---|---|---|
| 5,132,248 | A | 7/1992 | Drummond et al. | 437/173 |
| 6,294,401 | B1 | 9/2001 | Jacobson et al. | 438/99 |
| 2004/0147113 | A1 | 7/2004 | Yamazaki et al. | 438/660 |
| 2004/0164302 | A1 | 8/2004 | Arai et al. | 257/72 |
| 2005/0017373 | A1* | 1/2005 | Nishikawa et al. | 257/778 |
| 2005/0026423 | A1* | 2/2005 | Yamazaki | 438/637 |
| 2005/0135181 | A1 | 6/2005 | Shionoiri et al. | |
| 2005/0148121 | A1* | 7/2005 | Yamazaki et al. | 438/149 |

FOREIGN PATENT DOCUMENTS

| | | |
|---|---|---|
| JP | 04-213833 | 8/1992 |
| JP | 4-213833 | 8/1992 |
| JP | 08-112682 | 5/1996 |
| JP | 2004-282050 | 10/2004 |
| JP | 2005-183741 | 7/2005 |
| WO | WO-2005-057658 | 6/2005 |
| WO | WO 2005/119781 A1 | 12/2005 |

OTHER PUBLICATIONS

International Search Report (Application No. PCT/JP2006/315352) Dated Oct. 31, 2006, 4 pages.
Written Opinion (Application No. PCT/JP2006/315352) Dated Oct. 31, 2006, 4 pages.

* cited by examiner

*Primary Examiner*—Michael Trinh
(74) *Attorney, Agent, or Firm*—Husch Blackwell Sanders LLP

(57) ABSTRACT

A method for manufacturing a semiconductor device of the present invention is provided including the steps of forming a first conductive layer over a substrate; forming a second conductive layer containing a conductive particle and resin over the first conductive layer; and increasing an area where the first conductive layer and the second conductive layer are in contact with each other by irradiating the second conductive layer with a laser beam. By including the step of laser beam irradiation, the portion where the first conductive layer and the second conductive layer are in contact with each other can be increased and defective electrical connection between the first conductive layer and the second conductive layer can be improved.

12 Claims, 17 Drawing Sheets

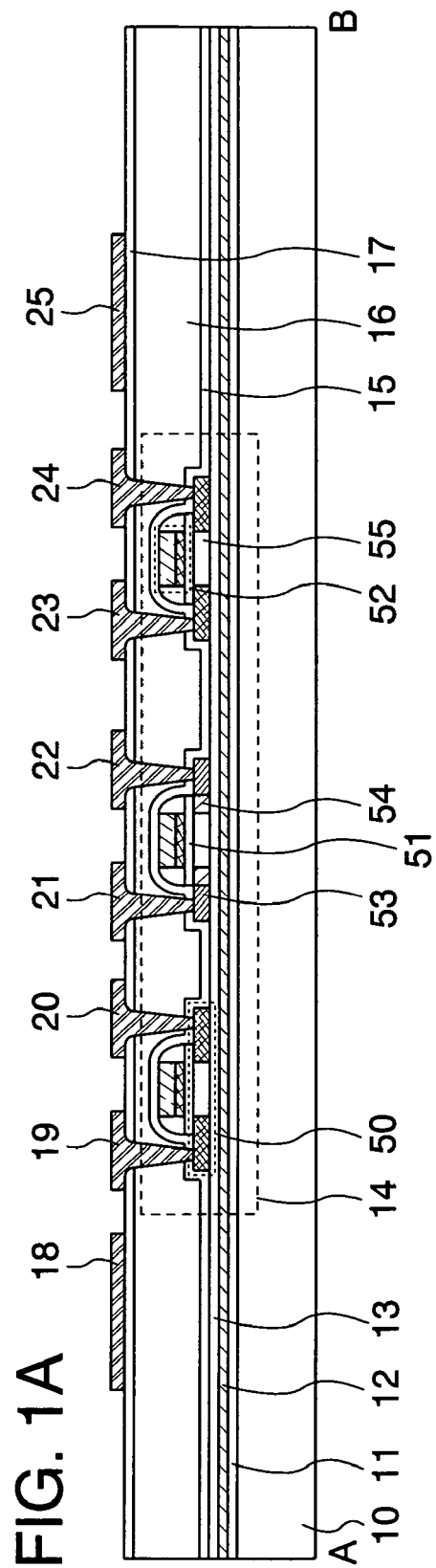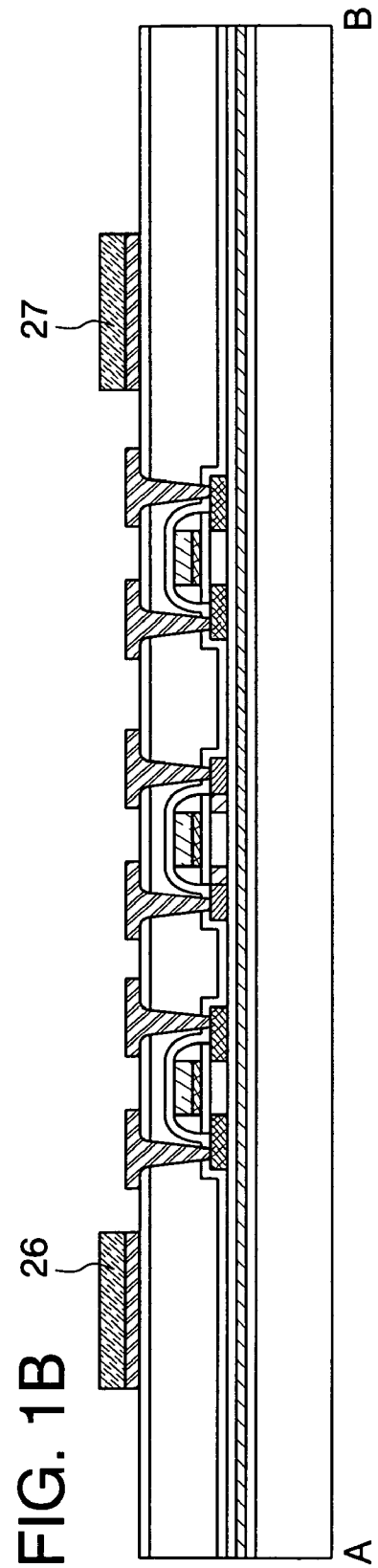

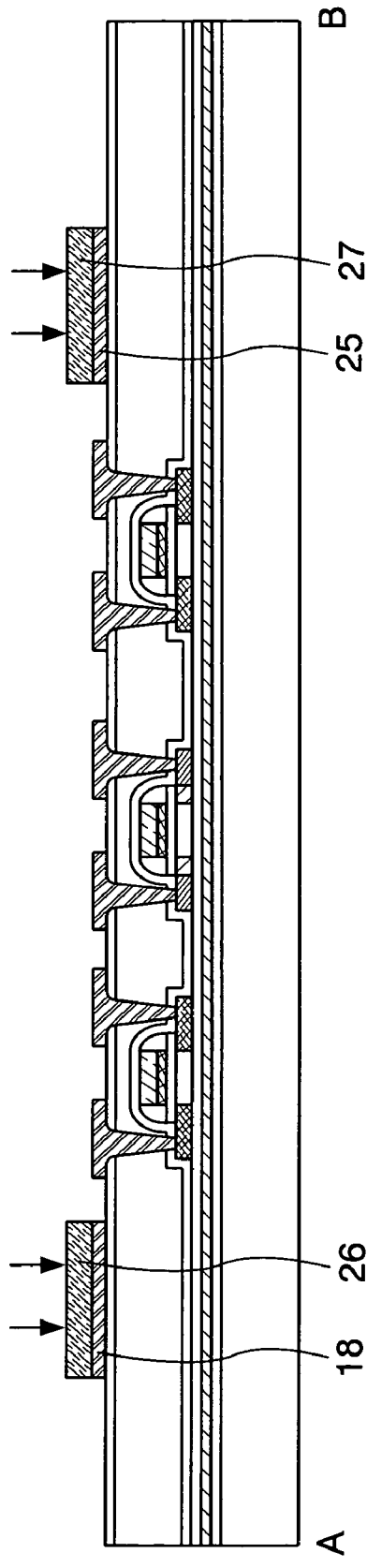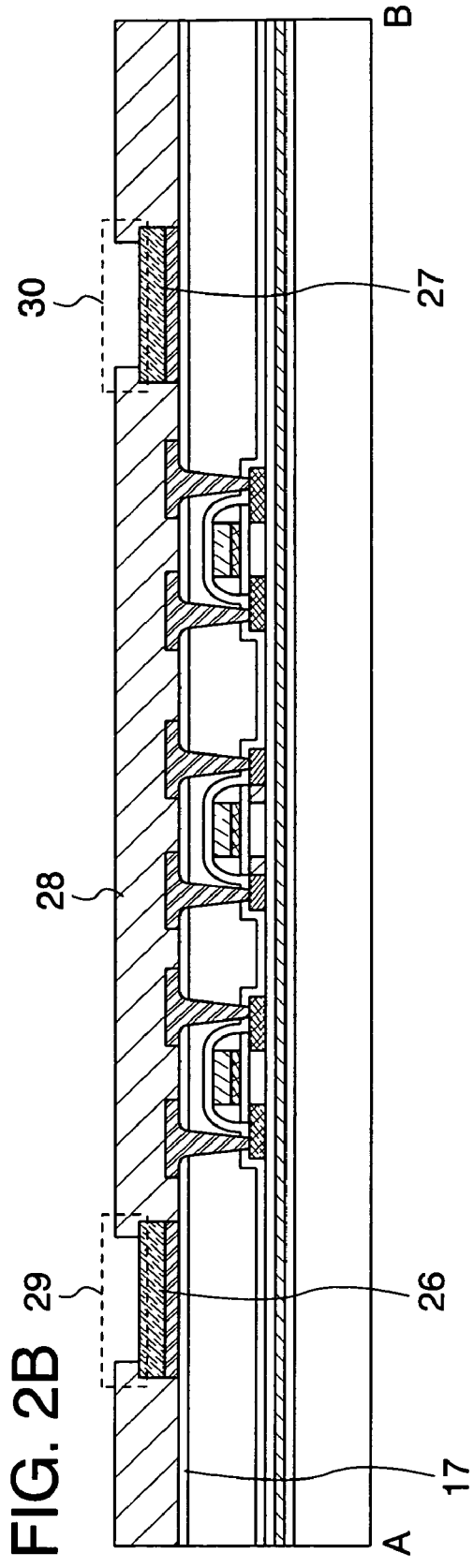

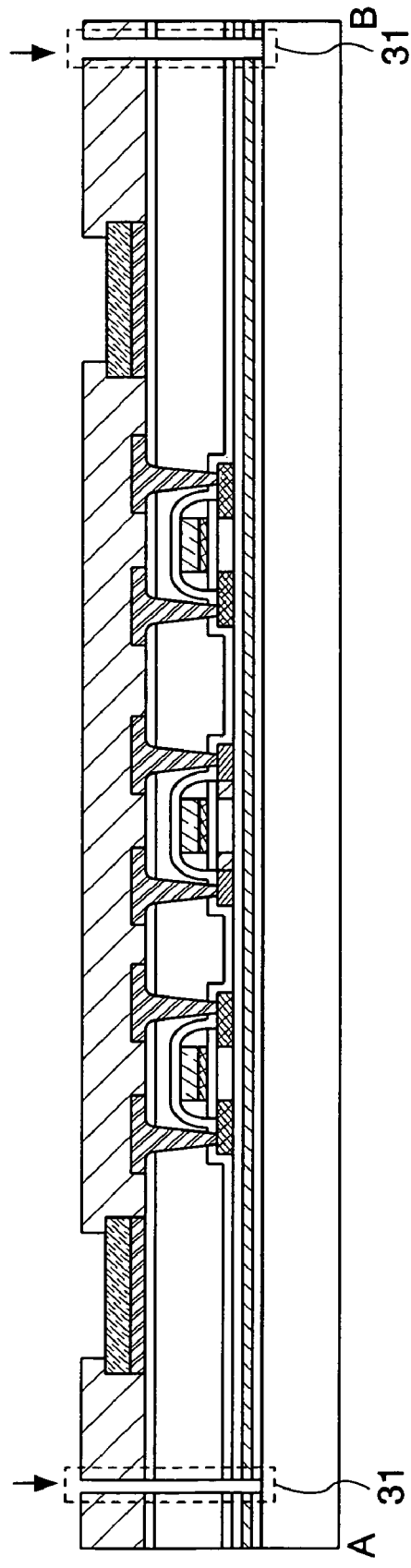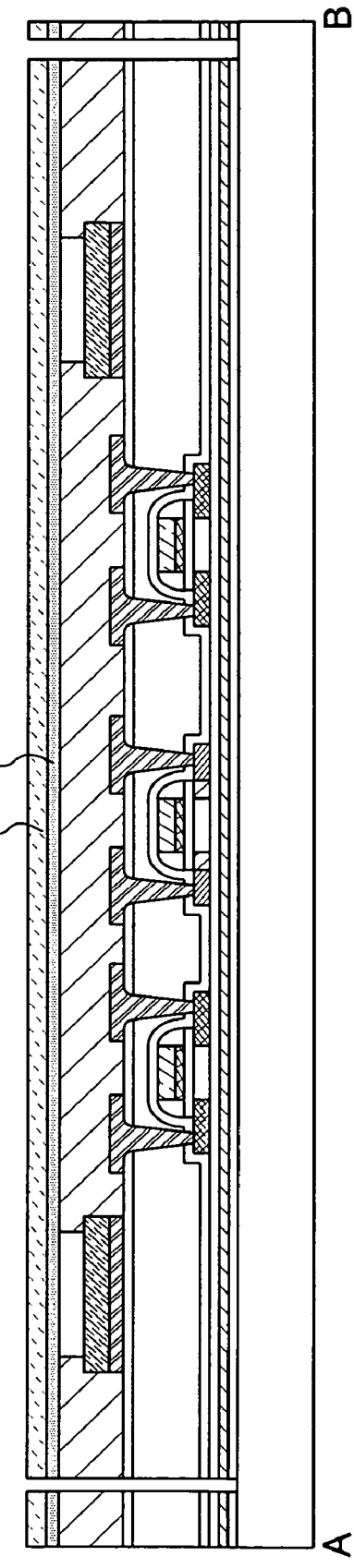

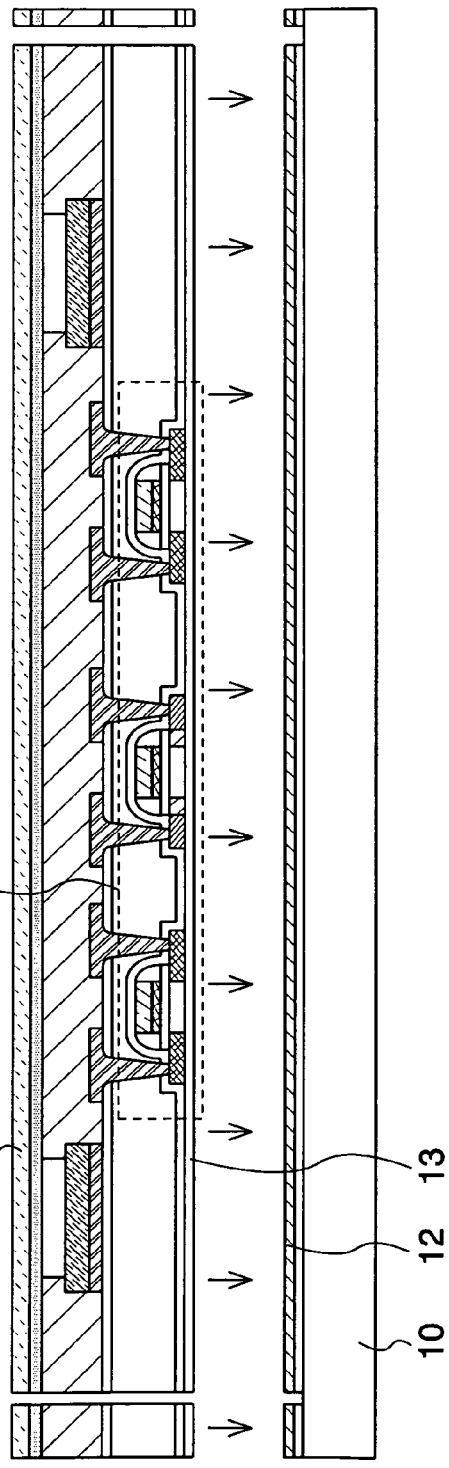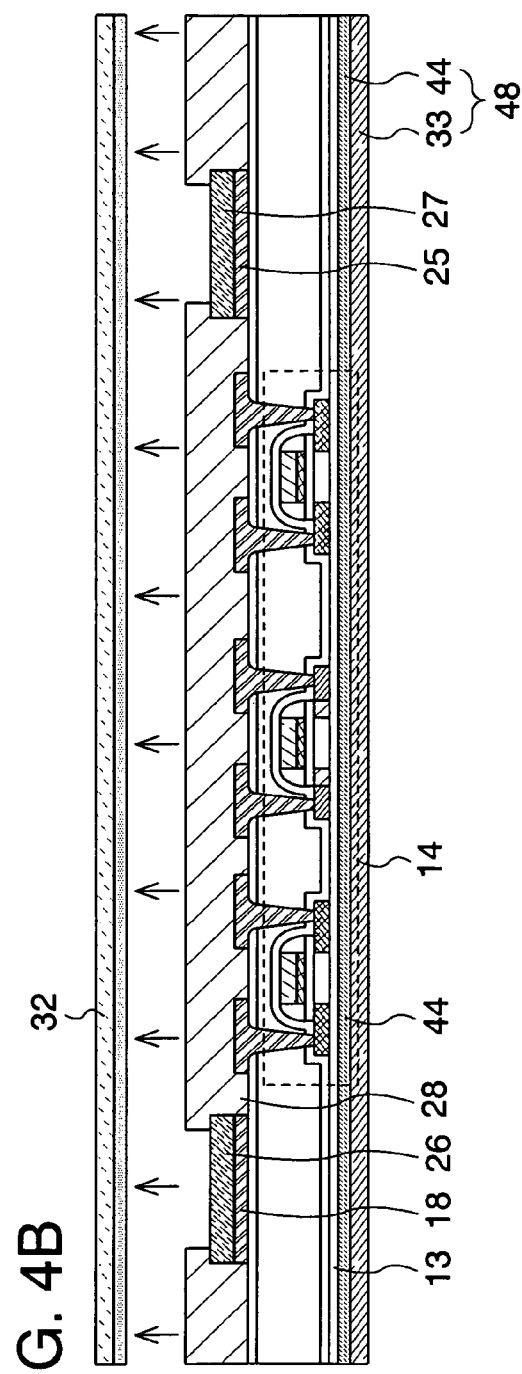

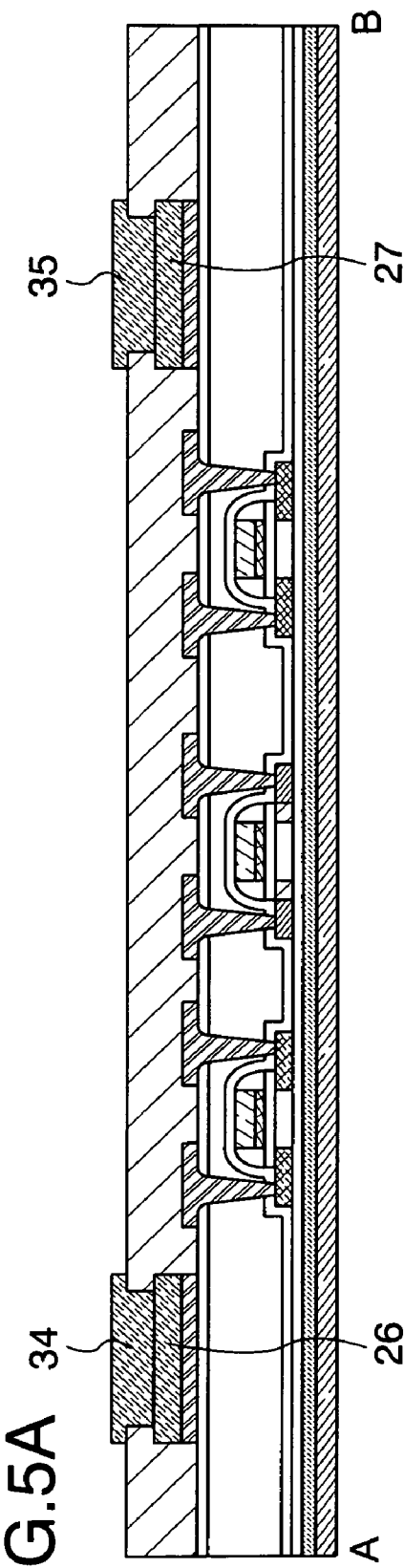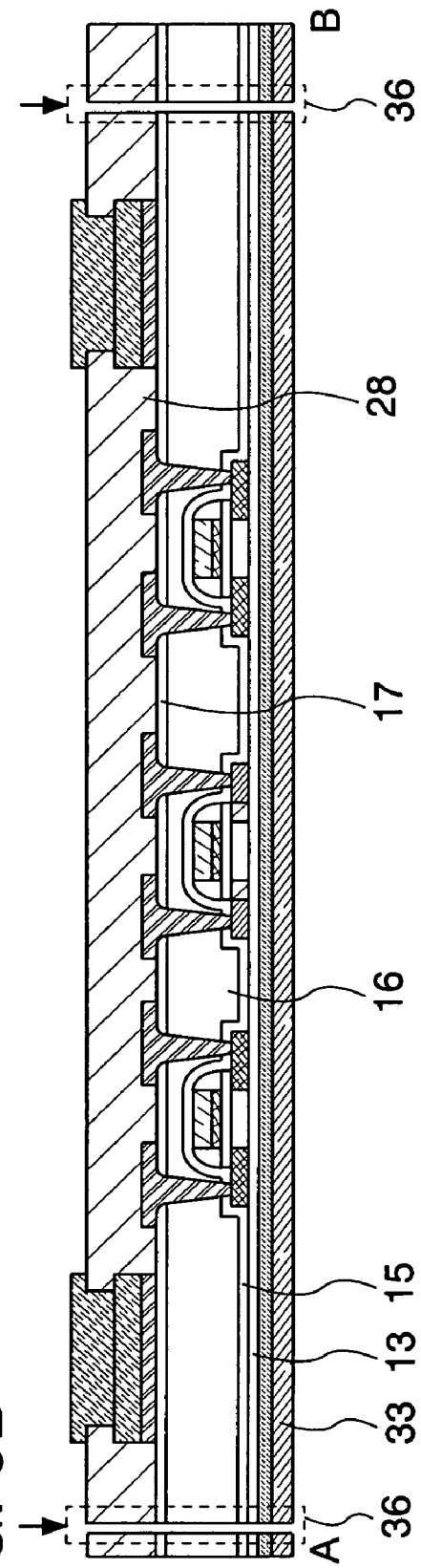
FIG.5A
FIG. 5B

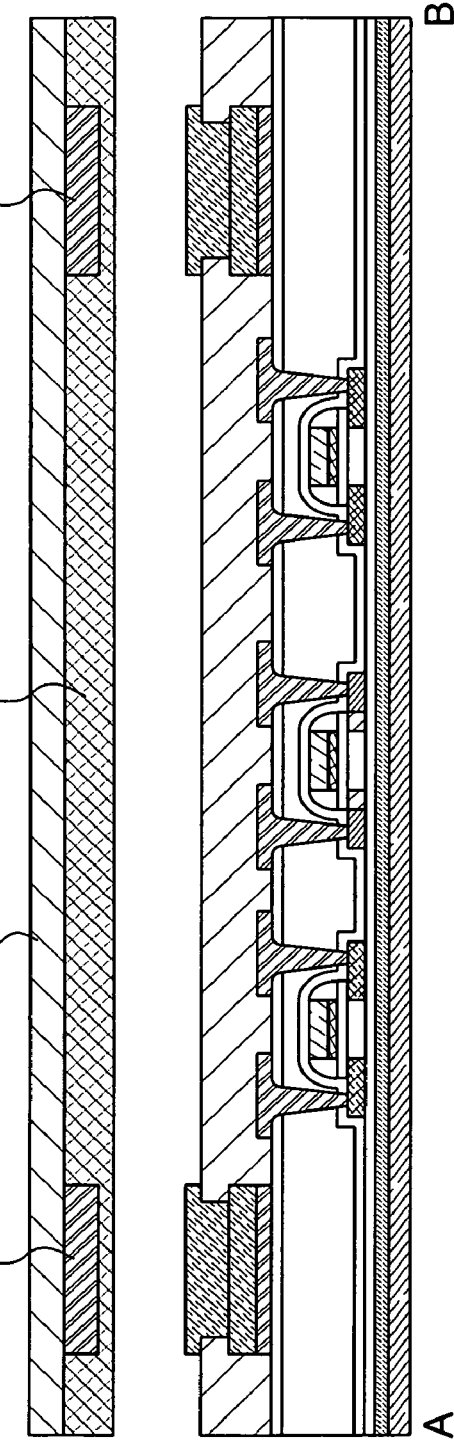
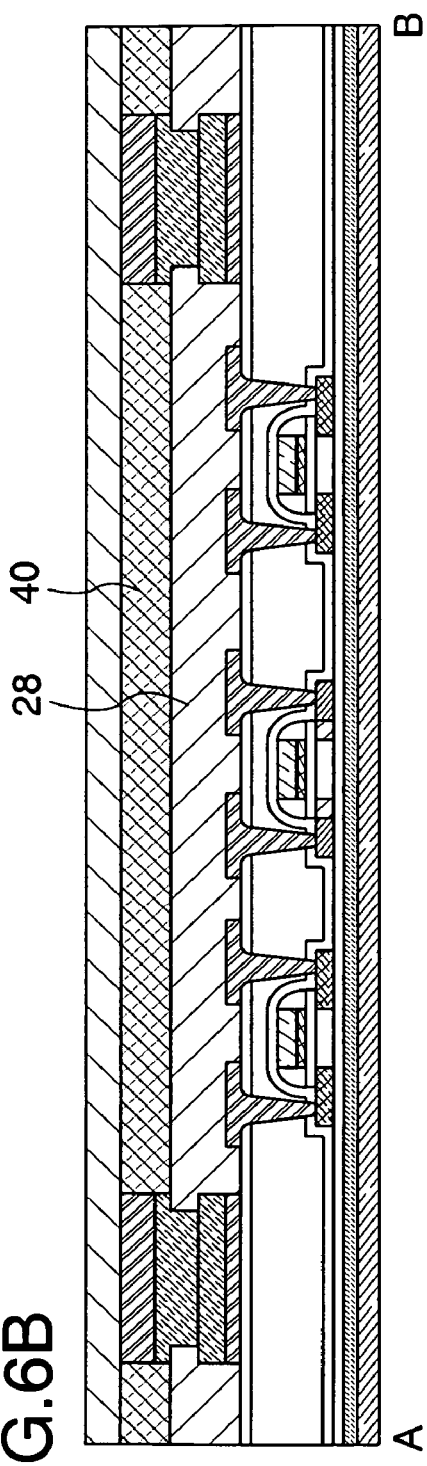
FIG.6A
FIG.6B

A 38  39 B 37  45  46

A 38  39 B 40

A 34  33  35 B 40

FIG. 12A
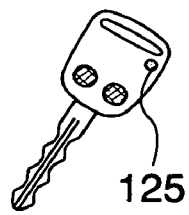
125
FIG. 12B
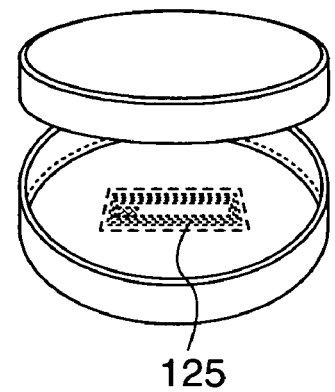
125
FIG. 12C
125
FIG. 12D
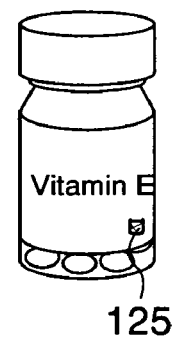
125
FIG. 12E
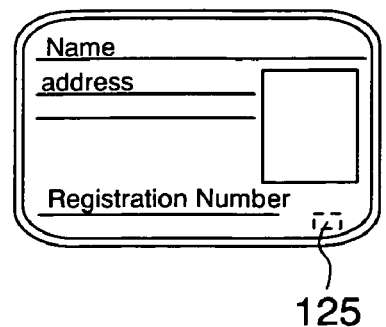
125
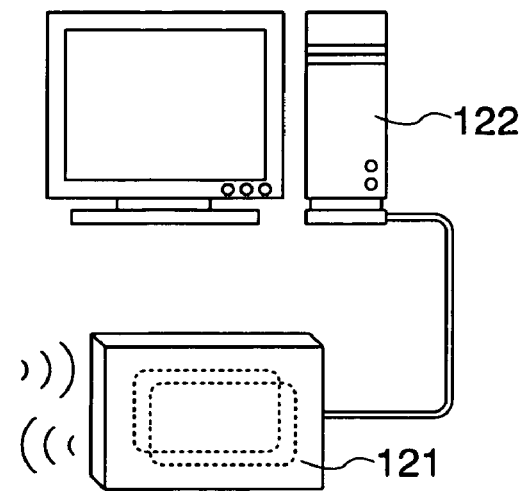
122
121

2.0 μm 201  213  211

MANUFACTURING METHOD OF SEMICONDUCTOR DEVICE

TECHNICAL FIELD

The present invention relates to a manufacturing method of a semiconductor device and the semiconductor device. The semiconductor device refers to a semiconductor device including a transistor.

BACKGROUND ART

In recent years, a semiconductor device capable of transmitting and receiving data without contact has been developed. Such a semiconductor device is referred to as an RFID (Radio Frequency Identification), an RF chip, an RF tag, an IC chip, an IC tag, an IC label, a wireless chip, a wireless tag, an electronic chip, an electronic tag, a wireless processor, a wireless memory, and the like (see Reference: Japanese Patent Application Laid-Open No. 2004-282050, for example), which has already been introduced into some fields.

DISCLOSURE OF INVENTION

It is an object of the present invention to provide a manufacturing method of a semiconductor device that can improve reliability, and the semiconductor device. In addition, it is another object of the present invention to provide a manufacturing method of a semiconductor device that can improve productivity.

Moreover, it is still another object of the present invention to provide a manufacturing method of a semiconductor device where reliability is improved, and the semiconductor device, by improving defective electrical connection. In particular, this is an object of the present invention to improve defective electrical connection between a first conductive layer and a second conductive layer containing conductive particles, in a case where the second conductive layer is formed over the first conductive layer.

One method for manufacturing a semiconductor device of the present invention includes the steps of forming a first conductive layer over a substrate; forming a second conductive layer over the first conductive layer; and irradiating a stacked body of the first conductive layer and the second conductive layer with a laser beam. By being irradiated with the laser beam, a portion where the first conductive layer and the second conductive layer are in contact with each other is increased; therefore, electrical connection can be obtained more certainly. Thus, reliability can be improved. As the first conductive layer, a layer containing titanium, tungsten, chromium, aluminum, tantalum, nickel, zirconium, hafnium, vanadium, iridium, niobium, lead, platinum, molybdenum, cobalt, or rhodium is formed. As the second conductive layer, a layer containing silver, gold, or copper is formed.

Another method for manufacturing a semiconductor device of the present invention includes the steps of providing a stacked body including a thin film transistor over a first substrate; and providing the stacked body over a second substrate, in addition to separating the stacked body from the first substrate, by performing heat treatment. The first substrate is provided with an adhesive layer where adhesion is decreased due to heat treatment, and the second substrate is provided with an adhesive layer where adhesion is increased due to heat treatment. Therefore, by performing heat treatment, two steps of separating the stacked body from the first substrate and providing the stacked body over the second substrate can be carried out simultaneously. In such a manner, the steps can be simplified and the productivity can be improved by using the two substrates provided with the adhesive layers each having a different property.

Still another method for manufacturing a semiconductor device of the present invention includes at least one of the above two steps. This method for manufacturing a semiconductor device of the present invention includes the steps of forming a peeling layer over a first substrate; forming a first insulating layer over the peeling layer; forming a transistor over the first insulating layer; forming a second insulating layer over the transistor; forming a first conductive layer connected to a source or a drain of the transistor through an opening provided in the second insulating layer; forming a second conductive layer in the same layer as the first conductive layer; forming a third conductive layer so as to be in contact with the second conductive layer; and irradiating the third conductive layer with a laser beam. The second conductive layer is a source or drain wiring. The third conductive layer is a connection terminal connected to external. The second conductive layer and the third conductive layer are electrically connected to each other. The steps of forming the second conductive layer and forming the third conductive layer may be carried out simultaneously.

Further, in addition to the above steps, the following steps are included: the steps of selectively forming a third insulating layer so as to expose part of the third conductive layer over the second insulating layer, the first conductive layer, and the third conductive layer; forming such an opening that the peeling layer is exposed by irradiating the second insulating layer and the third insulating layer with a laser beam; providing a second substrate over the surface of the third insulating layer; with the use of the second substrate, separating a stacked body including the first insulating layer and the transistor from the first substrate by using the inside of the peeling layer or the interface between the peeling layer and the first insulating layer as a boundary; separating the second substrate from the surface of the second insulating layer along with providing a third substrate over a surface of the first insulating layer; forming a fourth conductive layer connected to the third conductive layer through the opening provided in the third insulating layer; and providing a fourth substrate over the third insulating layer so as to electrically connect to each other the fourth conductive layer and a fifth conductive layer over the fourth substrate.

In the above methods for manufacturing a semiconductor device, the first substrate is a glass substrate. As the peeling layer, a layer containing tungsten or molybdenum is formed. As the second conductive layer, a layer containing the following is formed: titanium, tungsten, chromium, aluminum, tantalum, nickel, zirconium, hafnium, vanadium, iridium, niobium, lead, platinum, molybdenum, cobalt, or rhodium. As the third conductive layer, a layer containing silver, gold, or copper is formed. As the fourth conductive layer, a layer containing silver, gold, or copper is formed.

A semiconductor device of the present invention includes a transistor; a first insulating layer provided over the transistor; a first conductive layer connected to a source or a drain of the transistor through an opening provided in the first insulating layer; a second conductive layer provided in the same layer as the first conductive layer; and a second insulating layer provided over the first insulating layer, the first conductive layer, and the second conductive layer. In addition, the followings are included: a third conductive layer which is provided so as to fill an opening provided in the second insulating layer and which is in contact with the second conductive layer; a fourth conductive layer which is provided so as to fill the opening provided in the second insulating layer and which is in contact with the third conductive layer; a third insulating layer provided over the second insulating layer and the fourth conductive layer; a fifth conductive layer electrically connected to the fourth conductive layer through an opening provided in the third insulating layer; and a substrate provided over the third insulating layer and the fifth conductive layer.

In the semiconductor device having the above structure, the second conductive layer is a layer containing titanium, tungsten, chromium, aluminum, tantalum, nickel, zirconium, hafnium, vanadium, iridium, niobium, lead, platinum, molybdenum, cobalt, or rhodium. The third conductive layer is a layer containing silver, gold, or copper. The fourth conductive layer is a layer containing silver, gold, or copper. The fifth conductive layer serves as an antenna.

A method for manufacturing a semiconductor device of the present invention includes the steps of forming a first conductive layer over a substrate; forming a second conductive layer containing conductive particles of gold, silver, or copper (also referred to as conductive fine particles), and resin over the first conductive layer; and increasing an area (portion) where the first conductive layer and the second conductive layer are in contact with each other by irradiating the second conductive layer with a laser beam. The first conductive layer is formed by a sputtering method, a vapor deposition method, a CVD method, or a droplet discharging method. Preferably, the first conductive layer is formed by a sputtering method. In addition, the second conductive layer is formed by a printing method. Preferably, the second conductive layer is formed by a screen printing method. The second conductive layer is formed of conductive particles and resin in a paste shape. In the method for manufacturing a semiconductor device of the present invention, by including the step of laser beam irradiation, the portion where the first conductive layer and the second conductive layer are in contact with each other can be increased and defective electrical connection between the first conductive layer and the second conductive layer can be improved, even when the second conductive layer formed of conductive particles and resin is formed over the first conductive layer.

According to the present invention having the above structures, reliability can be improved by obtaining electrical connection of a stacked body of a plurality of the conductive layers more certainly. In addition, a plurality of steps can be carried out simultaneously by using the substrates provided with the adhesive layers each having a different property; thus, productivity can be improved.

BRIEF DESCRIPTION OF DRAWINGS

In the accompanying drawings:

FIGS. 1A and 1B are views each showing a semiconductor device of the present invention and a manufacturing method thereof;

FIGS. 2A and 2B are views each showing a semiconductor device of the present invention and a manufacturing method thereof;

FIGS. 3A and 3B are views each showing a semiconductor device of the present invention and a manufacturing method thereof;

FIGS. 4A and 4B are views each showing a semiconductor device of the present invention and a manufacturing method thereof;

FIGS. 5A and 5B are views each showing a semiconductor device of the present invention and a manufacturing method thereof;

FIGS. 6A and 6B are views each showing a semiconductor device of the present invention and a manufacturing method thereof;

FIGS. 12A to 12E are views each showing a semiconductor device of the present invention;

BEST MODE FOR CARRYING OUT THE INVENTION

Figure 7:
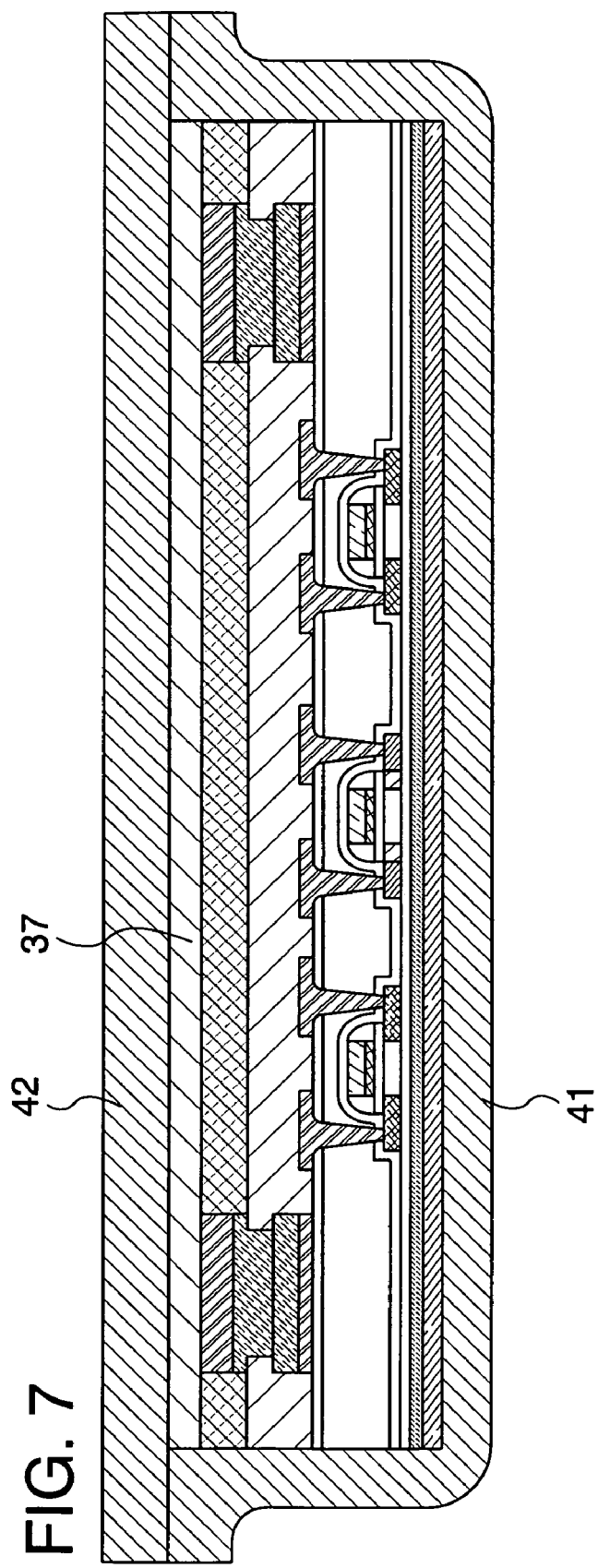
FIG. 7 is a view showing a semiconductor device of the present invention and a manufacturing method thereof.

Embodiment modes of the present invention will be explained with reference to the accompanying drawings. However, the present invention is not limited to the following explanations, and it is to be easily understood that various changes and modifications will be apparent to those skilled in the art. Therefore, unless such changes and modifications depart from the purport and the scope of the present invention, they should be construed as being included therein. Note that, in the structure of the present invention that will be hereinafter explained, the same reference numerals denoting the same portions are used in common in different drawings.

Figure 9A:
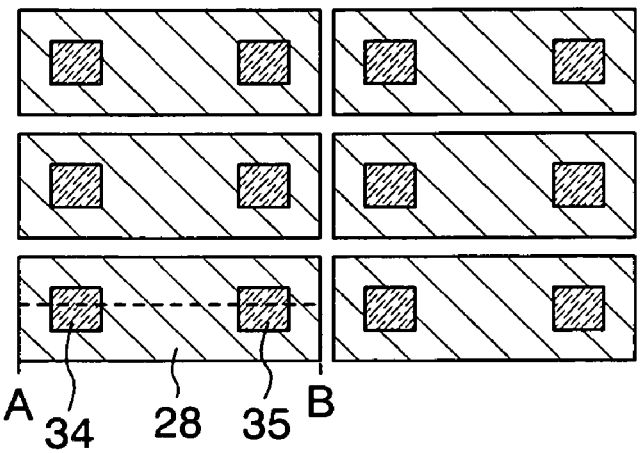
FIGS. 9A to 9C are views each showing a semiconductor device of the present invention and a manufacturing method thereof.
Figure 9B:
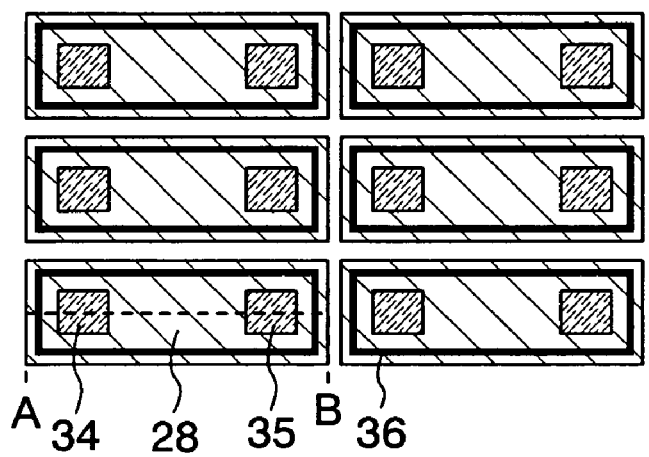
Figure 9C:
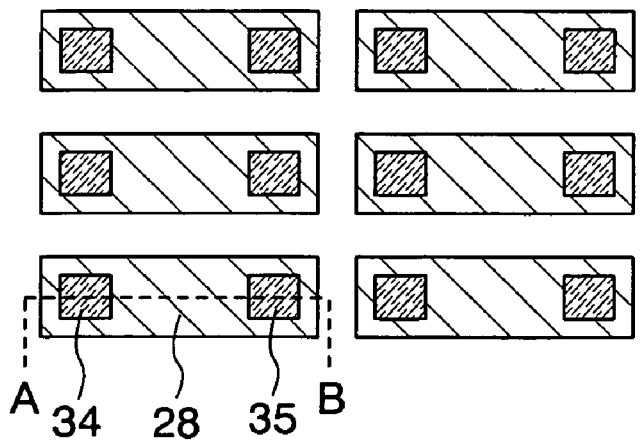
Figure 10A:
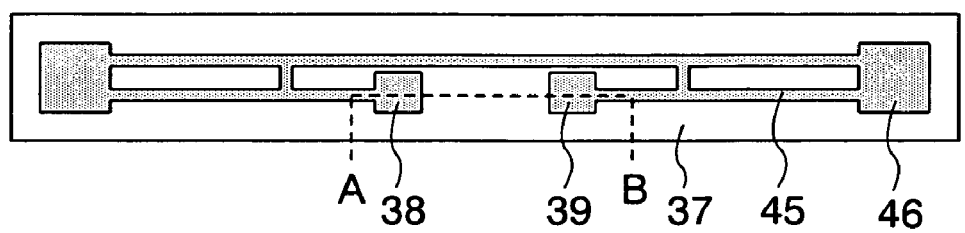
FIGS. 10A to 10C are views each showing a semiconductor device of the present invention and a manufacturing method thereof.
Figure 10B:
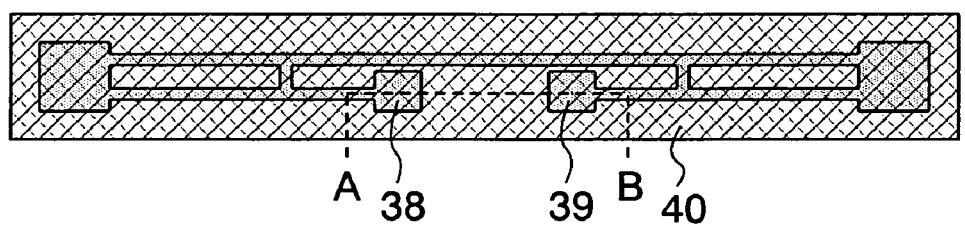
Figure 10C:
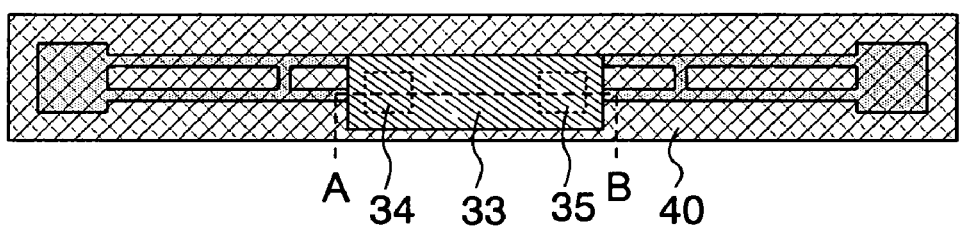

A semiconductor device of the present invention and a manufacturing method thereof will be explained with reference to cross-sectional views of FIGS. 1A and 1B, FIGS. 2A and 2B, FIGS. 3A and 3B, FIGS. 4A and 4B, FIGS. 5A and 5B, FIGS. 6A and 6B, FIG. 7, and top views of FIGS. 8A to 8D, FIGS. 9A to 9C, and FIGS. 10A to 10C. Note that FIG. 1A is a cross-sectional view taken along a line A-B of FIG. 8A; FIG. 1B, FIG. 8B; FIG. 2B, FIG. 8C; FIG. 5A, FIG. 9A; FIG. 5B, FIGS. 9B and 9C; FIG. 6A, FIGS. 10A and 10B; and FIG. 6B, FIG. 10C, respectively.

First, an insulating layer 11 is formed over one surface of a substrate 10 (see FIG. 1A). Next, a peeling layer 12 is formed over the insulating layer 11. Subsequently, an insulating layer 13 is formed over the peeling layer 12.

The substrate 10 is a substrate having an insulating surface, for example, a glass substrate, a plastic substrate, a quartz substrate, or the like. A glass substrate or a plastic substrate is preferably used as the substrate 10. This is because a glass substrate or a plastic substrate can be easily formed to have a size of 1 meter or more on one side, or can be easily formed to have a desired shape such as a rectangular shape. Thus, for example, when a glass substrate or a plastic substrate that is rectangular and 1 meter or more on one side is used, productivity can be drastically improved. Such a merit is highly advantageous, compared with a case of using a silicon substrate that is circular and approximately 30 centimeters at most in diameter.

As the insulating layers 11 and 13, oxide of silicon, nitride of silicon, oxide of silicon containing nitrogen, nitride of silicon containing oxygen, or the like is formed by a vapor phase growth method (a CVD method), a sputtering method, or the like. The insulating layer 11 has a function of preventing an impurity element from entering an upper layer from the substrate 10, and is not required to be formed, if not necessary.

By a sputtering method or the like, the peeling layer 12 is formed of a layer containing an element of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); or an alloy material or a compound material containing the element as its main component, in a single layer or a stacked layer. Note that the layer containing silicon may be any of amorphous, microcrystalline, and polycrystalline layers.

In the case where the peeling layer 12 has a single layer structure, a layer containing any of the following is preferably formed: tungsten, molybdenum, a mixture of tungsten and molybdenum, oxide of tungsten, oxynitride of tungsten, nitride oxide of tungsten, oxide of molybdenum, oxynitride of molybdenum, nitride oxide of molybdenum, oxide of a mixture of tungsten and molybdenum, oxynitride of a mixture of tungsten and molybdenum, and nitride oxide of a mixture of tungsten and molybdenum.

In the case where the peeling layer 12 has a stacked structure, preferably, a layer containing tungsten, molybdenum, or a mixture of tungsten and molybdenum is formed as the first layer, and a layer containing oxide of tungsten, oxide of molybdenum, oxide of a mixture of tungsten and molybdenum, oxynitride of tungsten, oxynitride of molybdenum, or oxynitride of a mixture of tungsten and molybdenum is formed as the second layer.

In the case where the peeling layer 12 is formed to have a stacked structure of tungsten and oxide of tungsten, forming a layer containing oxide of tungsten between a layer containing tungsten and a layer containing oxide of silicon may be applied by first forming the layer containing tungsten as the peeling layer 12, and forming the layer containing oxide of silicon as the insulating layer 13 in an upper layer thereof. In the case of forming a layer containing nitride of tungsten, oxynitride of tungsten, nitride oxide of tungsten, or the like, in the same manner, after forming the layer containing tungsten, a layer containing nitride of silicon, a silicon nitride layer containing oxygen, or a silicon oxide layer containing nitrogen is preferably formed in the upper layer thereof.

Next, a plurality of transistors 14 is formed over the insulating layer 13. In this step, thin film transistors are formed as the plurality of transistors 14.

Each of the plurality of transistors 14 has a semiconductor layer 50, a gate insulating layer (also referred to as an insulating layer) 51, and a conductive layer 52 which is a gate (also referred to as a gate electrode). The semiconductor layer 50 has impurity regions 53 and 54 each serving as a source or a drain, and a channel forming region 55. An impurity element imparting N-type conductivity (for example, phosphorus (P) or arsenic (As)) or an impurity element imparting P-type conductivity (for example, boron (B)) is added into the impurity regions 53 and 54. The impurity region 54 is an LDD (Lightly Doped Drain) region.

Each of the plurality of transistors 14 may be any of a top gate type in which the gate insulating layer 51 is provided over the semiconductor layer 50, and the conductive layer 52 is provided over the gate insulating layer 51; and a bottom gate type in which the gate insulating layer 51 is provided over the conductive layer 52, and the semiconductor layer 50 is provided over the gate insulating layer 51. Alternatively, one or a plurality of transistors selected from the plurality of transistors 14 may also be a multi-gate transistor having two or more gate electrodes and two or more channel forming regions.

In addition, only the plurality of transistors 14 is formed over the substrate 10; however, the present invention is not limited to this structure. An element provided over the substrate 10 is appropriately determined depending on the application of the semiconductor device. For example, in a case where the semiconductor device has a function of transmitting and receiving data without contact, preferably, only a plurality of transistors is formed over the substrate 10, or a plurality of transistors and a conductive layer serving as an antenna is formed over the substrate 10. Alternatively, in a case where the semiconductor device has a function of storing data, a plurality of transistors and a plurality of memory elements (for example, a transistor, a memory transistor, or the like) are preferably formed over the substrate 10. Further, in a case where the semiconductor device has a function of controlling a circuit, a function of generating a signal, or the like (for example, a CPU, a signal generating circuit, or the like), a plurality of transistors is preferably formed over the substrate 10. In addition to the above examples, other element such as a resistive element (also referred to as a resistor) or a capacitor element (also referred to as a capacitor) is formed, if necessary.

Next, insulating layers 15 to 17 are formed over the plurality of transistors 14. The insulating layers 15 to 17 are formed using oxide of silicon, nitride of silicon, polyimide, acrylic, siloxane, an oxazole resin, or the like by a vapor phase growth method, a sputtering method, an SOG (Spin On Glass) method, a droplet discharging method (for example, an inkjet method), or the like. Siloxane is composed of, for example, a skeleton structure formed by the bond of silicon and oxygen, in which an organic group containing at least hydrogen (for example, an alkyl group or aromatic hydrocarbon), a fluoro group, or an organic group containing at least hydrogen and a fluoro group is used as a substituent thereof. An oxazole resin is a photosensitive polybenzoxazole or the like, for example. Compared with a relative dielectric constant (approximately 3.2 to 3.4) of polyimide or the like, an oxazole resin has a lower relative dielectric constant (approximately 2.9); therefore, generation of parasitic capacitance of the semiconductor device can be suppressed. In addition, by suppressing generation of parasitic capacitance, high-speed operation can be performed in the semiconductor device.

Moreover, in the above structure, three insulating layers (15 to 17) are formed over the plurality of transistors 14; however, the present invention is not limited to this structure. The number of insulating layers stacked over the plurality of transistors 14 is not limited.

Figure 8A:
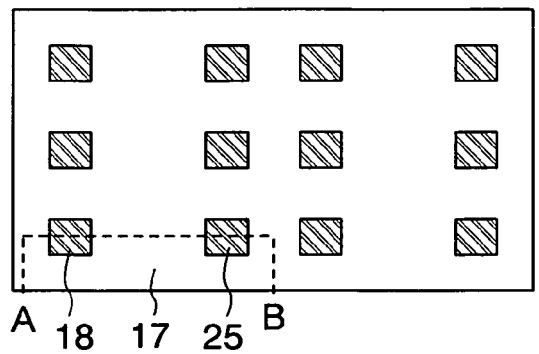
FIGS. 8A to 8D are views each showing a semiconductor device of the present invention and a manufacturing method thereof.

Then, openings are formed in the insulating layers 15 to 17, and conductive layers 19 to 24 connected to a source (also referred to as a source region or a source electrode) or a drain (also referred to as a drain region or a drain electrode) of each of the plurality of transistors 14, and conductive layers 18 and 25 are formed (see FIG. 1A and FIG. 8A). The conductive layers 18 and 25 are provided in the same layer as the conductive layers 19 to 24. In addition, the conductive layers 18 and 25 are terminals connected to external, and the conductive layers 19 to 24 are source or drain wirings. The conductive layers 18 and 25 are electrically connected to the conductive layers 19 to 24. Signals supplied from external are supplied to the plurality of transistors 14 through the conductive layers 18 and 25 and the conductive layers 19 to 24.

By a sputtering method or the like, the conductive layers 18 to 25 are formed of an element of titanium, tungsten, chromium, aluminum, tantalum, nickel, zirconium, hafnium, vanadium, iridium, niobium, lead, platinum, molybdenum, cobalt, rhodium, and the like; an alloy material containing the element as its main component; or a compound material of an oxide or a nitride containing the element as its main component, in a single layer or a stacked layer. As an example of the stacked structure of the conductive layers 18 to 25, there are a three-layer stacked structure of titanium, aluminum, and titanium; a five-layer stacked structure of titanium, titanium nitride, aluminum, titanium, and titanium nitride; a five-layer stacked structure of titanium, titanium nitride, aluminum added with silicon, titanium, and titanium nitride; and the like.

Next, conductive layers 26 and 27 are formed so as to be in contact with the conductive layers 18 and 25, respectively (see FIG. 1B and FIG. 8B). A layer containing gold, silver, or copper is formed by a screen printing method, a droplet discharging method, or the like as the conductive layers 26 and 27. Preferably, the conductive layers 26 and 27 are formed with a paste containing fine particles of silver (a material where fine particles of silver and resin are mixed) by using a screen printing method. A screen printing method is applied because a manufacturing time can be shortened and an apparatus cost is low. In addition, silver is used because of a low resistance value.

Then, laser beam irradiation is performed with a laser beam that can dissolve one or both the conductive layers 26 and 27, and the conductive layers 18 and 25 (see FIG. 2A). Although the conductive layers 18 and 26, and the conductive layers 25 and 27 are each partially in contact with each other before performing the laser beam irradiation, the portion where the conductive layers 18 and 26, and the conductive layers 25 and 27 are each in contact with each other can be increased by the laser beam irradiation. Therefore, electrical connection between the conductive layers 18 and 26, and the conductive layers 25 and 27 can be obtained more certainly; thus, reliability can be improved. As the laser beam, there are a gas laser, a liquid laser, and a solid state laser when classified by a medium; and a free electron laser, a semiconductor laser, and an X-ray laser when classified by a characteristic of oscillation; however, any of the lasers may be used in the present invention. Preferably, a gas laser or a solid state laser is used, and much preferably, a solid state laser is used. Moreover, either a continuous oscillation laser beam or a pulsed oscillation laser beam may be used in the present invention.

Next, an insulating layer 28 is selectively formed over the insulating layer 17 and the conductive layers 19 to 24 (see FIG. 2B and FIG. 8C). The insulating layer 28 is provided with openings 29 and 30. The conductive layers 26 and 27 are exposed through the openings 29 and 30.

Note that the openings 29 and 30 preferably have shapes so as to partially expose the surfaces of the conductive layers 26 and 27, instead of shapes so as to entirely expose the surfaces of the conductive layers 26 and 27. Specifically, the openings 29 and 30 preferably have the shapes so as to expose center portions of the conductive layers 26 and 27. This is in order to perform displacement at an accurate position with a high yield in the subsequent steps. In case where the insulating layer 28 is provided so as to entirely expose one surfaces of the conductive layers 26 and 27, a region where both the conductive layers 26 and 27, and the insulating layer 28 are not provided is formed in some cases. In the subsequent displacement step, displacement is performed by adhesion of the insulating layer 28 and a substrate 48; therefore, when there is a region where one of the conductive layers 26 and 27, and the insulating layer 28 is not provided, displacement cannot be performed accurately in some cases. However, in the above step, the insulating layer 28 is selectively provided so as to expose the center portions of the conductive layers 26 and 27. Accordingly, there is no region where one of the conductive layers 26 and 27, and the insulating layer 28 is not provided; thus, displacement can be performed accurately.

The insulating layer 28 is formed of an insulating resin such as an epoxy resin, an acrylic resin, or a polyimide resin to have a thickness of 5 to 200 μm, preferably 15 to 35 μm. In addition, the insulating layer 28 is formed uniformly by using a screen printing method, a droplet discharging method, or the like. Preferably, a screen printing method is used. A screen printing method is applied because a manufacturing time can be shortened and an apparatus cost is low. Thereafter, heat treatment is performed, if necessary.

Figure 8B:
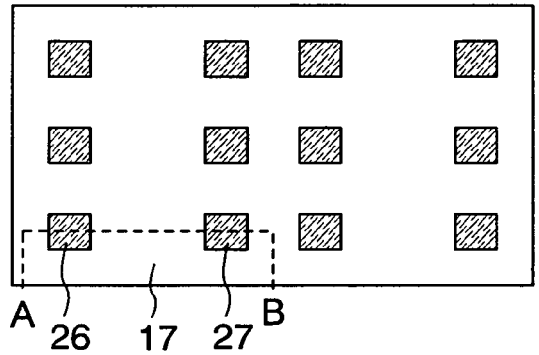
Figure 8C:
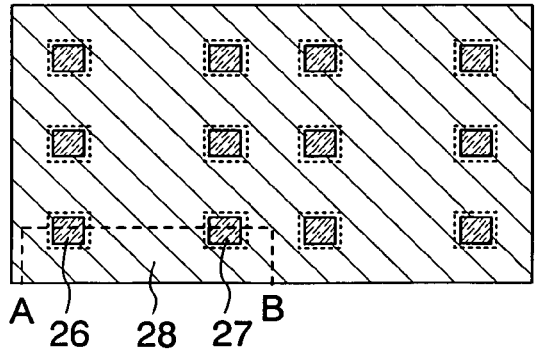
Figure 8D:
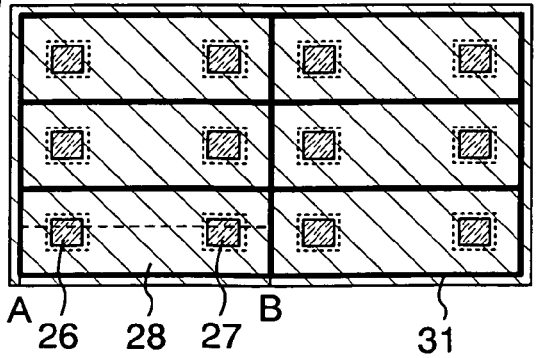

Then, an opening 31 so as to expose at least part of the peeling layer 12 is formed (see FIG. 3A and FIG. 8D). In terms of a short processing time, this step is preferably carried out by laser beam irradiation. Laser beam irradiation is performed to the substrate 10, the insulating layer 11, the peeling layer 12, and the insulating layers 13, 15 to 17, and 28. In addition, the surface of the insulating layer 28 is irradiated with a laser beam. The opening 29 is formed so as to expose at least part of the peeling layer 12. Therefore, the opening 29 is provided at least for the insulating layers 13, 15 to 17, and 28. The structure shown in the figure is a case where a laser beam reaches up to the insulating layer 11, and the insulating layers 11, 13, 15 to 17, and 28 are separated. Note that the substrate 10 may also be separated with a laser beam.

In the step of irradiation of the above laser beam, ablation processing is used. In the ablation processing, a phenomenon is used, in which a molecular bond in a portion irradiated with a laser beam, that is, a portion which has absorbed a laser beam, is cut, photolyzed, and vaporized. In other words, a molecular bond in a portion of the insulating layer 11, the peeling layer 12, and the insulating layers 13, 15 to 17, and 28 is cut by the laser beam irradiation, and photolyzed and vaporized to form the opening 31.

In addition, as a laser, a solid state laser with a wavelength of 150 to 380 nm that is an ultraviolet ray region is preferably used. Preferably, an Nd:YVO$_4$ laser with a wavelength of 150 to 380 nm is used. This is because, as for the Nd:YVO$_4$ laser with a wavelength of 150 to 380 nm, light is easily absorbed in the substrate compared with other laser on longer wavelength side, and ablation processing is possible. Moreover, the periphery of a processed portion is not affected and processability is favorable.

Next, the substrate 48 is provided over the insulating layer 28 (see FIG. 3B). The substrate 48 is a substrate where an insulating layer 32 and an adhesive layer 43 are stacked, which is a heat-peeling substrate. The adhesive layer 43 is a layer the adhesivity of which decreases by heat treatment. The followings can be given as examples of the adhesive layer 43: a layer formed of a material utilizing softening of a thermoplastic adhesive at the time of heating; a layer formed of a material where a microcapsule that expands by heating or a foaming agent is mixed; a layer formed of a material where thermal meltability or a pyrolytic property is given to a thermosetting resin; or a layer using deterioration of interface intensity due to penetration of moisture or expansion of a water-absorbing resin due to the deterioration.

Then, with the use of the substrate 48, the stacked body including the plurality of transistors 14 is separated from the substrate 10 (see FIG. 4A). The stacked body including the plurality of transistors 14 is separated from the substrate 10 by using the inside of the peeling layer 12 or the interface between the peeling layer 12 and the insulating layer 13 as a boundary. The structure shown in the figure is the case where the stacked body is separated by using the interface between the peeling layer 12 and the insulating layer 13 as a boundary. In such a manner, the separation step can be carried out easily in a short time by using the substrate 48.

Next, in addition to providing a substrate 49 over the surface of the insulating layer 13 by heat treatment, the stacked body including the plurality of transistors 14 is separated from the substrate 48 (see FIG. 4B). The substrate 49 is a substrate where an insulating layer 33 and an adhesive layer 44 are stacked. The adhesive layer 44 is a layer the adhesivity of which increases by heat treatment, which corresponds to a layer containing a thermoplastic resin. The thermoplastic resin corresponds to polyethylene, polystyrene, polypropylene, polyvinyl chloride, and the like, for example.

As described above, since the substrate 48 is a heat-peeling substrate, the adhesivity between the substrate 48 and the insulating layer 28 decreases by heat treatment; thus, the stacked body including the plurality of transistors 14 is separated from the substrate 48. At the same time, the thermoplastic resin over the surface of the substrate 49 is cured by heat treatment; thus, the adhesivity between the insulating layer 13 and one surface of the substrate 49 increases. In such a manner, the step of separating the stacked body from the substrate 48 and the step of providing the stacked body over the substrate 49 can be carried out simultaneously by using the two substrates 48 and 49 provided with the adhesive layers each having a different property. Thus, a manufacturing time can be shortened.

Then, the conductive layers 26 and 27 are irradiated again with a laser beam, if necessary. This is performed in order to improve such defective electrical connection between the conductive layers 18 and 26, and between the conductive layers 25 and 27, which can be caused due to the adverse effect of the above separation step. Thus, the step of laser beam irradiation does not have to be performed, if not necessary.

Next, conductive layers 34 and 35 are formed to be in contact with the conductive layers 26 and 27, respectively (see FIG. 5A and FIG. 9A). As the conductive layers 34 and 35, a layer containing gold, silver, or copper is formed by using a screen printing method, a droplet discharging method, or the like. Preferably, the conductive layers 34 and 35 are formed of a paste containing fine particles of silver (a material where fine particles of silver and resin are mixed) by using a screen printing method. A screen printing method is applied because a manufacturing time can be shortened and an apparatus cost is low. In addition, silver is applied because of a low resistance value. Thereafter, heat treatment is performed, if necessary.

Then, the substrate 49, the insulating layers 13, 15 to 17, and 28 are irradiated with a laser beam to form openings 36 (see FIG. 5B and FIGS. 9B and 9C).

Next, a substrate 37, over which an antenna (a conductive layer serving as an antenna) 45 and a capacitor element 46 are provided, is prepared (see FIG. 6A and FIG. 10A). The antenna 45 and the capacitor element 46 are each formed by using a screen printing method, a droplet discharging method, or the like. FIG. 6A shows conductive layers 38 and 39 which are parts of the antenna 45. An anisotropic conductive layer 40 is a material where a conductive filler is provided in an adhesive, which is also referred to as an ACP (Anisotropic Conductive Paste). The anisotropic conductive layer 40 is uniformly formed by using a screen printing method, a droplet discharging method, or the like.

Then, the substrates 49 and 37 adhere to each other by using the anisotropic conductive layer 40 (see FIG. 6B and FIG. 10B). Then, if necessary, the insulating layer 28 and the anisotropic conductive layer 40 are attached to each other. At this time, one or both pressure treatment and heat treatment are performed by a flip chip bonder, a die bonder, an ACF bonder, a pressure bonder, or the like.

Note that the conductive layers 35 and 39 may be in direct contact with each other (see FIG. 6B). Alternatively, the anisotropic conductive layer 40 may also be provided between the conductive layers 35 and 39.

Further, another substrate may also be provided over the surface of the stacked body including the plurality of transistors 14 (see FIG. 7). Specifically, a new substrate may also be provided over one or both of the surfaces of the substrates 49 and 37. In the structure shown in the figure, a substrate 41 is provided over the surface of the substrate 49, and a substrate 42 is provided over the surface of the substrate 37. By providing the substrates 41 and 42, intensity thereof can be further improved. The stacked body including the plurality of transistors 14 is sealed with the substrates 41 and 42 by melting a layer over each surface of the substrates 41 and 42, or the adhesive layers over each surface of the substrates 41 and 42 by heat treatment. In addition, pressure treatment is also performed, if necessary.

Embodiment 1

In the above embodiment mode, the stacked body including the plurality of transistors 14 is separated from the substrate 10 (see FIG. 4A); however, the present invention is not limited to this mode. The substrate 10 may be thinned after forming the conductive layers 18 to 25 (see FIG. 1A).

In order to thin the substrate 10, the other surface of the substrate 10 is ground by using a grinding apparatus (for example, a grinder). Preferably, the substrate 10 is ground so as to have a thickness of 100 µm or less. Next, the other surface of the ground substrate 10 is polished by using a polishing apparatus (for example, a polishing pad or a polishing abrasive grain (for example, cerium oxide or the like)). Preferably, the substrate 10 is polished so as to have a thickness of 50 µm or less, preferably 20 µm or less, and much preferably 5 µm or less. In order to thin the substrate 10, one or both grinding and polishing are preferably carried out. Moreover, before carrying out the grinding step and the polishing step, a layer for protection is preferably formed over each of the conductive layers 18 to 25, if necessary. Further, after the grinding step and the polishing step, one or both a cleaning step for removing dusts and a drying step are preferably carried out, if necessary.

The thickness of the thinned substrate 10 may be appropriately determined in consideration of time required for the grinding step and the polishing step, time required for a cutting step, an application of a semiconductor device, the strength required for the application of the semiconductor device, and the like. For example, in a case where productivity is improved by shortening the time for the grinding step and the polishing step, the thickness of the substrate 10 after polishing is preferably set to be approximately 50 µm. In addition, in a case where productivity is improved by shortening the time required for a cutting step, the thickness of the substrate 10 after polishing is preferably set to be 20 µm or less, much preferably 5 µm or less. Moreover, in a case where a semiconductor device is attached to or embedded in a thin product, the thickness of the substrate 10 after polishing is preferably set to be 20 μm or less, much preferably 5 μm or less. Further, a lower limit of the thickness of the thinned substrate 10 is not particularly limited. The substrate 10 may be thinned until the substrate 10 is removed (until the thickness of the substrate 10 becomes 0 μm).

Next, conductive layers 26 and 27 are formed so as to be in contact with the conductive layers 18 and 25, respectively (see FIG. 1B). Then, the conductive layers 26 and 27 are irradiated with a laser beam (see FIG. 2A). Then, an insulating layer 28 is selectively formed (see FIG. 2B). After laser beam irradiation, openings 31 are formed (see FIG. 3A). In the structure shown in the figure, the substrate 10 is not cut in forming the openings 31; however, preferably, the substrate 10 is also cut in the case of thinning the substrate 10. Thus, the step of separating the stacked body including the plurality of transistors 14 from the substrate 10 is preferably omitted. The subsequent steps are the same as those described above (see FIG. 3B, FIGS. 4A and 4B, FIGS. 5A and 5B, and FIGS. 6A and 6B). When the thinned substrate 10 is left without separating the stacked body including the plurality of transistors 14 from the substrate 10, the intrusion of harmful gas, moisture, or an impurity element can be suppressed. Thus, deterioration or breakdown can be suppressed and reliability can be improved. Moreover, a barrier property can be improved.

Embodiment 2

Figure 11:
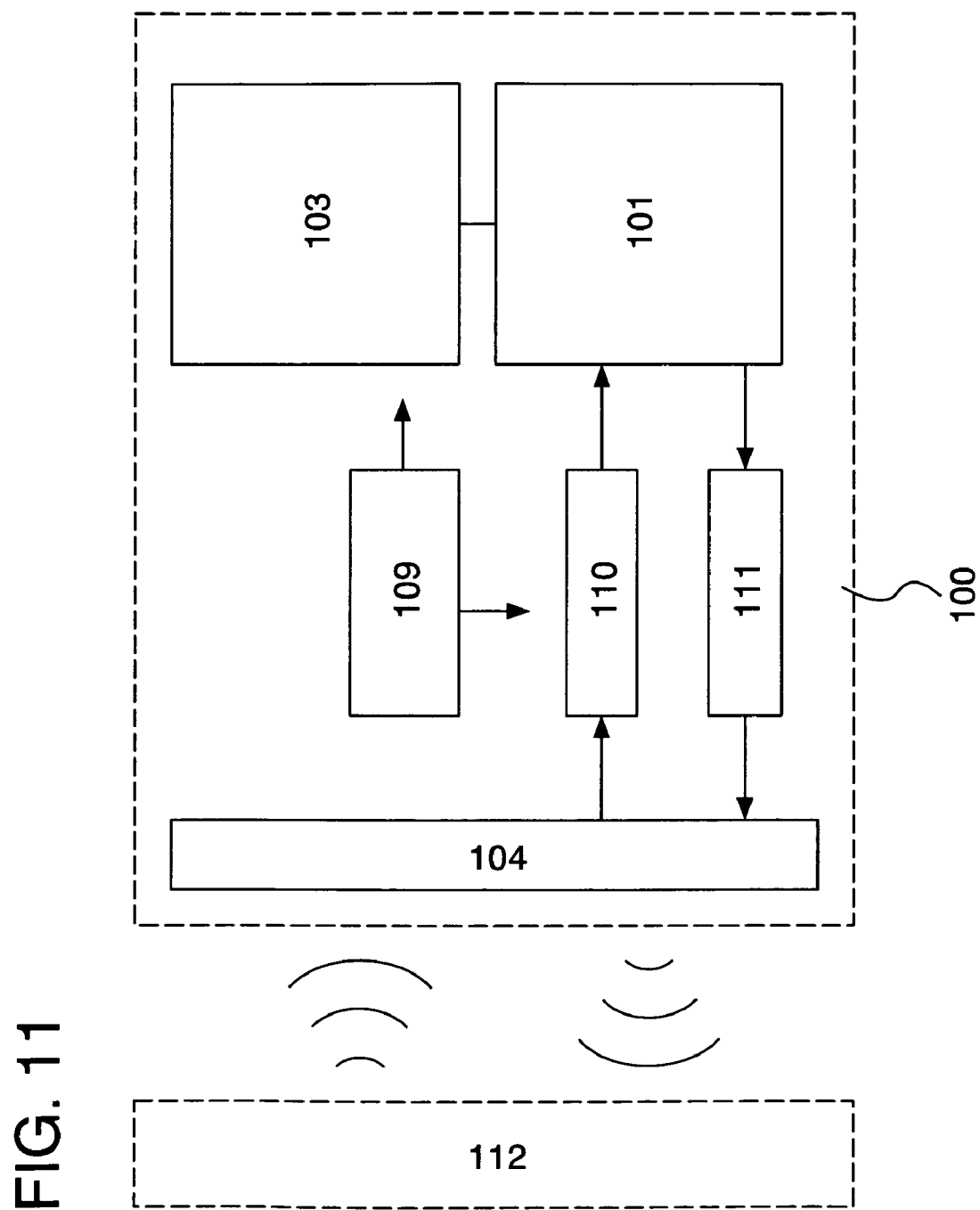
FIG. 11 is a diagram showing a semiconductor device of the present invention.
Figure 13A:
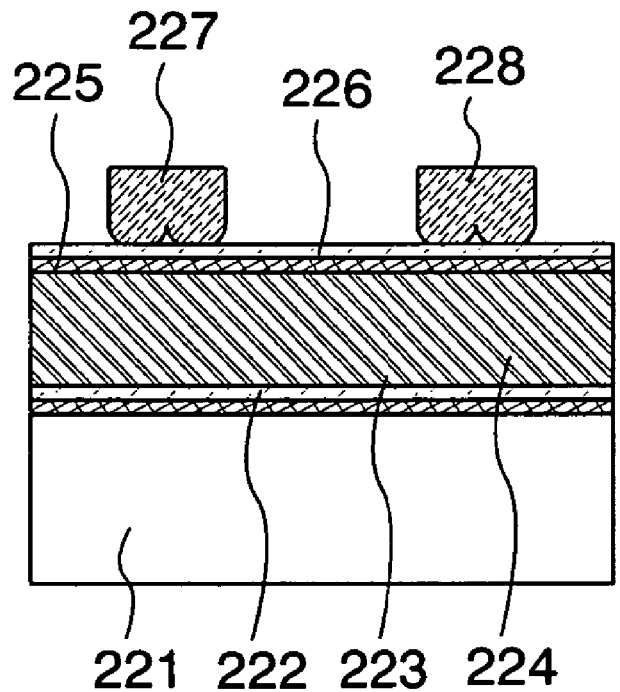
FIGS. 13A and 13B are views each showing an experiment and a result thereof.
Figure 13B:
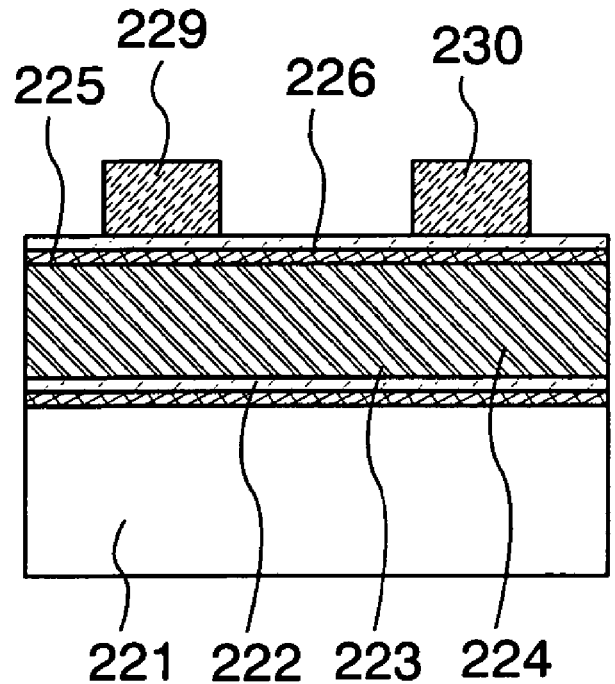

A configuration of a semiconductor device of the present invention will be explained with reference to FIG. 11. A semiconductor device 100 of the present invention includes an arithmetic processing circuit 101, a memory circuit 103, an antenna 104, a power supply circuit 109, a demodulation circuit 110, and a modulation circuit 111.

The arithmetic processing circuit 101 analyzes a command, controls the memory circuit 103, outputs data to be transmitted to the outside into the modulation circuit 111, or the like, based on a signal inputted from the demodulation circuit 110.

The memory circuit 103 includes a circuit having a memory element and a control circuit for controlling writing and reading of data. The memory circuit 103 stored at least an identification number of the semiconductor device. The identification number is used for distinguishing the semiconductor device from other semiconductor devices. In addition, the memory circuit 103 includes one or plural kinds of memories of an organic memory, a DRAM (Dynamic Random Access Memory), a SRAM (Static Random Access Memory), a FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure in which a layer containing an organic compound is interposed between a pair of conductive layers. Since the organic memory has a simple structure, a manufacturing process can be simplified and cost can be reduced. In addition, by the simple structure, an area of a stacked body can be easily reduced and high integration can be easily achieved. Moreover, there are also advantages that the organic memory is nonvolatile and does not require incorporation of a battery. Thus, it is preferable to use the organic memory for the memory circuit 103.

The antenna 104 converts a carrier wave supplied from a reader/writer 112 into an alternating electrical signal. In addition, load modulation is applied from the modulation circuit 111. The power supply circuit 109 generates power supply voltage by using the alternating electrical signal converted by the antenna 104 and supplies the power supply voltage to each circuit.

The demodulation circuit 110 demodulates the alternating electrical signal converted by the antenna 104 and supplies the demodulated signal to the arithmetic processing circuit 101. The modulation circuit 111 applies load modulation to the antenna 104, based on a signal supplied from the arithmetic processing circuit 101.

The reader/writer 112 receives the load modulation applied to the antenna 104 as a carrier wave. In addition, the reader/writer 112 transmits the carrier wave to the semiconductor device 100. Note that the carrier wave refers to an electromagnetic wave generated in the reader/writer 112.

By configuring the above circuits with a transistor included in the semiconductor device of the present invention, the semiconductor device can have a function of transmitting and receiving data without contact.

Embodiment 3

A semiconductor device 125 of the present invention can be used in various objects and various systems by utilizing a function capable of transmitting and receiving data without contact. The various objects include, for example, keys (see FIG. 12A), bills, coins, securities, bearer bonds, certificates (a driver's license, a resident's card, or the like), books, packing containers (a petri dish or the like; see FIG. 12B), personal accessories and ornaments (a bag, glasses, or the like; see FIG. 12C), packing and wrapping containers (wrapping paper, a bottle, or the like; see FIG. 12D), recording media (a disk, a video tape, or the like), vehicles (a bicycle or the like), foods, clothing, everyday articles, electronic devices (a liquid crystal display device, an EL display device, a television device, a portable terminal, or the like), and the like. The semiconductor device of the present invention is fixed by being attached to the surfaces of the objects having various forms as described above, or being embedded into the objects.

In addition, the various systems include a physical distribution-inventory management system, a certification system, a distribution system, a production record system, a book management system, and the like. By utilizing a function of the semiconductor device of the present invention, high-function, multifunction, and a high-added value of the system can be achieved. For example, the semiconductor device of the present invention is provided inside with an identification card, and a reader/writer 121 is provided at an entrance of a building or the like (see FIG. 12E). The reader/writer 121 reads an identification number inside the identification card that every person possesses and supplies information related to the identification number that has been read to a computer 122. The computer 122 determines whether to permit the person's entrance or exit, based on the information supplied from the reader/writer 121. In such a manner, by utilizing the semiconductor device of the present invention, an entrance-exit management system, in which high-function and a high-added value are achieved, can be provided.

Embodiment 4

An example of a substrate provided with a conductive layer, which is used for a semiconductor device of the present invention, will be explained. As the substrate provided with a conductive layer, for example, the following two types of substrate are given. The conductive layer serves as an antenna or a connection wiring.

One of them is a substrate over which a conductive layer is provided. The conductive layer is formed of copper, silver, gold, aluminum, titanium, or the like. An exposed portion of the conductive layer is plated with gold or the like for preventing oxidation.

The other of them is a substrate over which a conductive layer is provided, and a protective layer is provided over the conductive layer. The protective layer contains an insulating resin, for example, an epoxy resin, a silicon resin, a synthetic rubber based resin, or the like. An opening is provided at a desired place of the protective layer, and the conductive layer is exposed through the opening.

When a conductive layer 221 over a substrate 220 serves as an antenna, the shape of the conductive layer 221 is not limited (see FIGS. 16A to 16D). As the shape, for example, a linear shape (a dipole antenna or the like; see FIG. 16A), a flat rectangular shape (a patch antenna or the like; see FIG. 16B), a circular shape (a loop antenna, a spiral antenna, or the like; see FIG. 16C), a ribbon shape (see FIG. 16D), or the like is given. Then, over the substrate 220 over which the conductive layer 221 is provided, a stacked body 222 including a plurality of transistors is attached, thereby completing the semiconductor device capable of transmitting and receiving data without contact.

In addition, a material for forming the conductive layer is not particularly limited. For example, gold, silver, copper, or the like is preferably used as a material. Among all, silver may be preferably used because of a low resistance value. Moreover, a manufacturing method thereof is not particularly limited either, and a sputtering method, a screen printing method, a droplet discharging method, or the like is preferably used.

Note that, when an antenna is directly attached to a surface of a metal film, eddy current is generated in the metal film due to magnetic flux which penetrates through the surface of the metal film. Such eddy current is generated in the reversed direction to a magnetic field of a reader/writer. Thus, ferrite or a metal thin film sheet with high magnetic permeability and less loss of high frequency is preferably interposed between an antenna and a conductive layer to prevent generation of eddy current.

Embodiment 5

In order to suppress adverse effect due to electrostatic, it is preferable to use an antistatic substrate capable of suppressing generation of an electric charge for a semiconductor device of the present invention. Thus, the antistatic substrate will be explained with reference to FIGS. 17A to 17E. Hereinafter, the antistatic substrate will be explained by being broadly classified into five types.

Figure 17A:
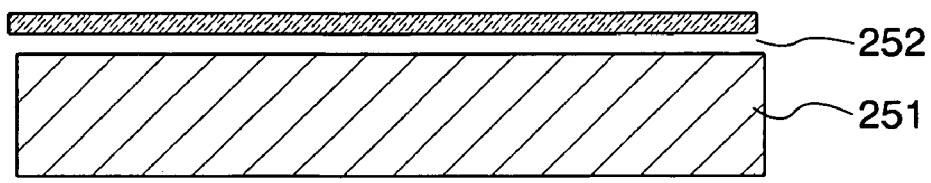
FIGS. 17A to 17E are views each showing an anti-electrostatic substrate.

The first type is a substrate where a layer 252 containing a conductive material is provided over an insulating layer 251 (see FIG. 17A). As the layer 252 containing a conductive material, a layer containing a metal such as aluminum, gold, zinc, or indium tin oxide is formed by using an electroplating method, a vapor deposition method, a sputtering method, or the like. Alternatively, as the layer 252 containing a conductive material, a layer containing a conductive coating material is formed. A conductive coating material is a material where fine particles of a conductive material (such as particles of carbon black or silver) are mixed in a coating material.

Figure 17B:
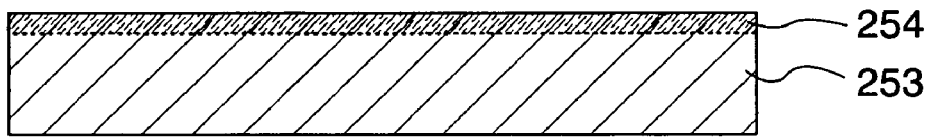
Figure 17C:
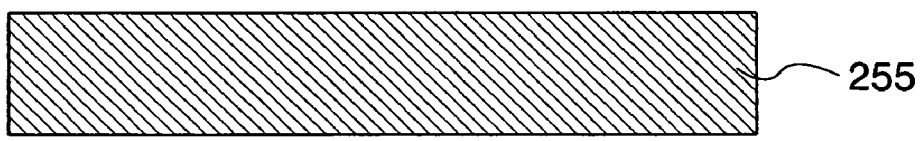

The second type is a substrate where a hydrophilic layer 254 is provided over a surface of an insulating layer 253 and (see FIG. 17B). In order to achieve hydrophilicity, treatment by acid or surface treatment by plasma is used. The third type is a substrate including an insulating layer 255 mixed with a conductive material (see FIG. 17C). As the conductive material, a metal powder, carbon black, a carbon fiber, or the like is used.

By discharging an electric charge, which is charged in the substrate, and grounding one end of substrate, an electric charge can be easily removed like the above three substrates. Thus, adverse effect due to electrostatic can be suppressed.

Figure 17D:
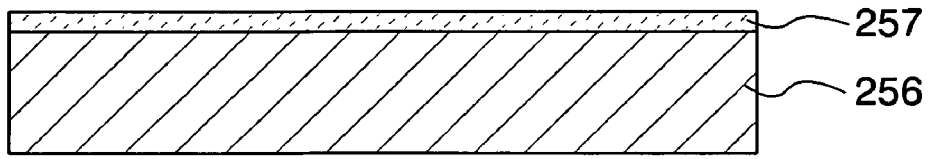
Figure 17E:
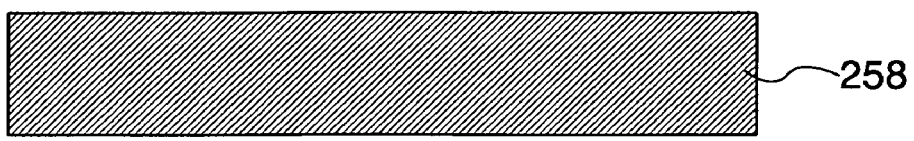

The fourth type is a substrate where an insulating layer 256 and a layer 257 containing an antistatic agent are provided over the insulating layer 256 (see FIG. 17D). The fifth type is a substrate including an insulating layer 258 mixed with an antistatic agent (see FIG. 17E). The antistatic agent is classified into an anionic antistatic agent, a cationic antistatic agent, an amphoteric antistatic agent, and a non-ionic antistatic agent. As an anionic antistatic agent, there is alkylsulfonate salt or the like; a cationic antistatic agent, tetraalkylammonium salt or the like; an amphoteric antistatic agent, alkyl betaine or the like; and a non-ionic antistatic agent, glycerin fatty acid ester or the like.

By using an antistatic agent, leakage of an electric charge which is charged in a substrate can be promoted like the above two substrates. Thus, adverse effect due to electrostatic can be suppressed.

The insulating layers 251, 253, and 256 are formed by using the following: silicone, polyethylene, polypropylene, polystyrene, an AS resin, an ABS resin (a resin where acrylonitrile, butadiene, and styrene are polymerized), an acrylic resin, polyvinyl chloride, polyacetal, polyamide, polycarbonate, modified polyphenylene ether, polybutylene terephthalate, polyethylene naphthalate, polyethylene terephthalate, poly sulfone, polyethersulfone, polyphenylene sulfide, polyamide imide, polymethylpentene, a phenol resin, a urea resin, a melamine resin, an epoxy resin, a diallyl phthalate resin, an unsaturated polyester resin, polyimide, polyurethane, or the like.

In addition, each of the above substrates (also referred to as a base, a film, or a tape) preferably has a flexible property. In addition, an adhesive layer may be provided over the surface of the substrate. The adhesive layer is a layer including an adhesive. Moreover, the surface of the substrate may be coated with silicon dioxide (silica). By the coating, even when the substrate is in an atmosphere with a high temperature and a high humidity, a waterproof property can be maintained. Further, the surface may be coated with a material containing carbon as its main component (for example, diamond like carbon). By the coating, strength is enhanced, and deterioration and breakdown of the stacked body including the plurality of transistors 14 can be suppressed.

Embodiment 6

A semiconductor device of the present invention has a plurality of transistors. Each of the plurality of transistors has a semiconductor layer, a gate insulating layer, and a gate electrode. Hereinafter, an example of a manufacturing method of the semiconductor layer included in each of the plurality of transistors will be explained.

First, an amorphous semiconductor layer is formed by a sputtering method, an LPCVD method, a plasma CVD method, or the like. Next, the amorphous semiconductor layer is crystallized by a laser crystallization method, an RTA (Rapid Thermal Anneal) method, a thermal crystallization method using an annealing furnace, a thermal crystallization method using a metal element promoting crystallization, a method in which a thermal crystallization method using a metal element promoting crystallization and a laser crystallization method are combined, or the like to form a crystalline semiconductor layer. Then, the crystallized semiconductor layer is processed into a desired shape.

Among the above manufacturing methods, a combination of a crystallization method with heat treatment and a crystallization method in which irradiation of a continuous wave laser beam or a laser beam oscillating with a frequency of 10 MHz or more is preferably used. By irradiating the crystallized semiconductor layer with a continuous wave laser beam or a laser beam oscillating with a frequency of 10 MHz or more, the surface of the crystallized semiconductor layer can be planarized. In addition, by planarizing the surface of the crystallized semiconductor layer, a gate insulating layer, which is formed in an upper layer of the semiconductor layer, can be thinned. Further, pressure resistance of the gate insulating layer can be improved.

Moreover, among the above manufacturing methods, a continuous wave laser beam or a laser beam oscillating with a frequency of 10 MHz or more is preferably used. A semiconductor layer, which is crystallized by being scanned in one direction while being irradiated with a continuous wave laser beam or a laser beam oscillating with a frequency of 10 MHz or more, has a characteristic that crystals are grown in a scanning direction of the beam. A transistor in which characteristic variation is reduced and field effect mobility is high can be obtained by arranging the transistor so that the scanning direction is aligned with a channel length direction (a direction in which carriers are flown when a channel forming region is formed) and by employing the following manufacturing method to form a gate insulating layer.

Next, an example of a manufacturing method of the gate insulating layer included in each of the plurality of transistors will be explained. The gate insulating layer is preferably formed by performing plasma treatment to the semiconductor layer; therefore, the surface of the semiconductor layer is oxidized or nitrided. For example, plasma treatment is employed, in which a mixed gas containing a rare gas (such as He, Ar, Kr, or Xe) and oxygen, oxidized nitrogen, ammonia, nitrogen, hydrogen, and the like is introduced. In this case, when excitation of plasma is performed by introducing a microwave, plasma with a low electron temperature and high density can be generated. The surface of the semiconductor layer can be oxidized or nitrided by oxygen radicals (OH radicals may be included) or nitrogen radicals (NH radicals may be included) generated by this high density plasma. Accordingly, an insulating layer having a thickness of 5 to 10 nm is formed over the semiconductor layer. This insulating layer having a thickness of 5 to 10 nm is preferably used as the gate insulating layer.

Since a reaction of this case due to treatment using high density plasma is a solid-phase reaction, an interface state density between the gate insulating layer and the semiconductor layer can be extremely low. In such high density plasma treatment, since the semiconductor layer (crystalline silicon or polycrystalline silicon) is directly oxidized (or nitrided), variation in a thickness of a gate insulating layer that is formed can be made to be extremely small. In addition, a semiconductor layer in a crystal grain boundary of crystalline silicon is not oxidized too much, and an extremely desirable state can be obtained. In other words, in the high density plasma treatment shown here, by solid-phase oxidation of the semiconductor layer surface, a gate insulating layer which has favorable uniformity and low interface state density can be formed without excessive oxidation in a crystal grain boundary.

As for the gate insulating layer included in the transistor, only the insulating layer formed by high density plasma treatment may be used. Alternatively, an insulating layer of silicon oxide, silicon oxynitride, silicon nitride, or the like may be formed by being stacked by a CVD method using plasma or a thermal reaction, in addition to the insulating layer formed by high density plasma treatment. In any case, characteristic variation can be reduced in the transistor including the insulating layer formed by high density plasma as the gate insulating layer or part of the gate insulating layer.

In addition, the semiconductor layer, the gate insulating layer, and other insulating layer included in the transistor are formed by plasma treatment in some cases. Such plasma treatment is preferably performed with an electron density of $1 \times 10^{11}$ cm$^{-3}$ or more and an electron temperature of plasma of 1.5 eV or less. In more detail, the plasma treatment is preferably performed with an electron density of $1 \times 10^{11}$ cm$^{-3}$ to $1 \times 10^{13}$ cm$^{-3}$ and an electron temperature of plasma of 0.5 eV to 1.5 eV.

When plasma has high electron density and a low electron temperature in the vicinity of an object to be processed (for example, a semiconductor layer, a gate insulating layer, and the like included in a transistor), the object to be processed can be prevented from being damaged due to plasma. In addition, an electron density of plasma is as high as $1 \times 10^{11}$ cm$^{-3}$ or more. Therefore, oxide or nitride, which is formed by oxidizing or nitriding an object to be irradiated using plasma treatment, is superior to a thin film formed by a CVD method, a sputtering method, or the like in uniformity of a thickness or the like, and a denser film can be formed. Moreover, the electron temperature of the plasma is as low as 1.5 eV or less. Therefore, oxidizing treatment or nitriding treatment can be performed at a lower temperature, compared with conventional plasma treatment or a thermal oxidation method. For example, even when plasma treatment is performed at a temperature lower than a strain point of a glass substrate by 100° C. or more, the object to be processed is sufficiently oxidized or nitrided; thus, oxide or nitride can be formed.

Embodiment 7

An experiment was carried out to examine the difference of resistance values before and after irradiating stacked conductive layers with a laser beam. The experiment, a result thereof, and a cross-sectional structure after irradiating the stacked conductive layers with a laser beam will be explained with reference to FIGS. 13A and 13B, FIGS. 14A to 14D, and FIGS. 15A and 15B.

In the experiment, two samples of a sample A and a sample B were prepared. As the sample A, a first conductive layer 222, a second conductive layer 223, a third conductive layer 224, a fourth conductive layer 225, and a fifth conductive layer 226 were formed by being stacked over a substrate 221. In addition, sixth conductive layers 227 and 228 were formed over the fifth conductive layer 226 (see a schematic view of a cross section of the sample A in FIG. 13A).

As well as the sample A, the sample B was formed by stacking a first conductive layer 222, a second conductive layer 223, a third conductive layer 224, a fourth conductive layer 225, and a fifth conductive layer 226 over a substrate 221. In addition, two sixth conductive layers were formed over the fifth conductive layer 226, and then, the surfaces of the sixth conductive layers were irradiated with an Nd:YVO$_4$ laser having a wavelength of 266 nm. As a result, sixth conductive layers 229 and 230 irradiated with the laser beam were formed (see a schematic view of a cross section of the sample B in FIG. 13B).

Note that the first conductive layer 222 was a layer containing titanium; the second conductive layer 223, a layer containing titanium nitride; the third conductive layer 224, a layer containing aluminum; the fourth conductive layer 225, a layer containing titanium; and the fifth conductive layer 226, a layer containing titanium nitride. In addition, the sixth conductive layers 227, 228, 229, and 230 were each a layer containing a silver paste. The silver paste contained an epoxy resin and fine particles of silver.

Next, the resistance values between the sixth conductive layers 227 and 228 of the sample A and between the sixth conductive layers 229 and 230 of the sample B were measured. As a result, the resistance value of the sample A was 4.00 Ω, whereas the resistance value of the sample B was 0.14 Ω. According to this result, it was found that the resistance value is reduced by the laser beam irradiation.

Then, a sample C was prepared. As the sample C, a first conductive layer 202, a second conductive layer 203, a third conductive layer 204, a fourth conductive layer 205, and a fifth conductive layer 206 were formed by being stacked over a substrate 201. In addition, a sixth conductive layer 207 was formed over the fifth conductive layer 206 (see schematic views of a cross section and a top view of the sample C in FIGS. 14A and 14B). The first conductive layer 202 was a layer containing titanium; the second conductive layer 203, a layer containing titanium nitride; the third conductive layer 204, a layer containing aluminum; the fourth conductive layer 205, a layer containing titanium; the fifth conductive layer 206, a layer containing titanium nitride; and the sixth conductive layer 207, a layer containing a silver paste.

Figure 14A:
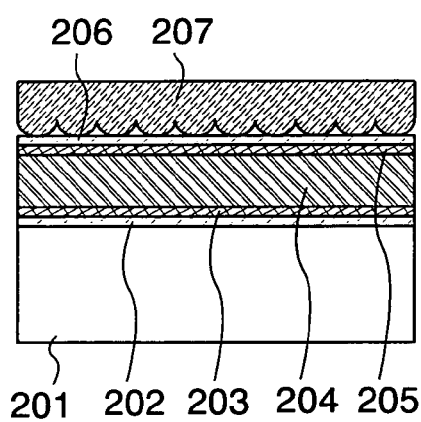
FIGS. 14A to 14D are views each showing an experiment and a result thereof.
Figure 14B:
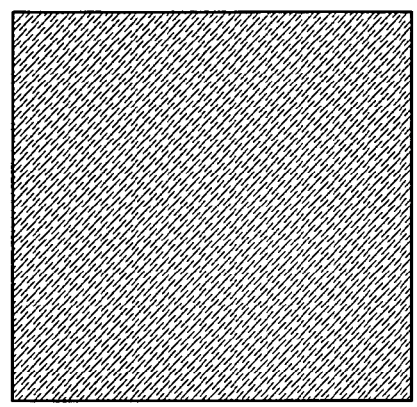
Figure 14C:
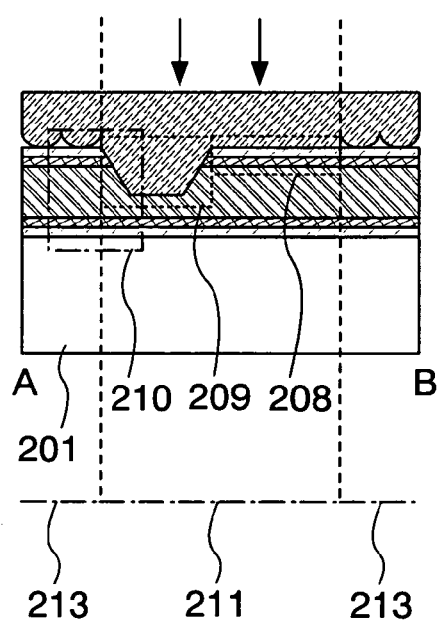
Figure 14D:
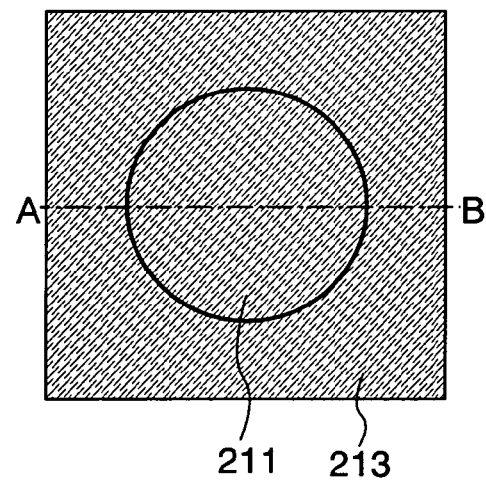

Next, the sixth conductive layer 207 was irradiated with an Nd: YVO$_4$ laser having a wavelength of 266 nm (see schematic views of a cross section and a top view of the sample C in FIGS. 14C and 14D, and FIGS. 15A and 15B). In FIG. 14C and FIG. 15B, a region 211 is a region irradiated with a laser beam, and a region 213 is a region which is not irradiated with a laser beam.

Figure 15A:
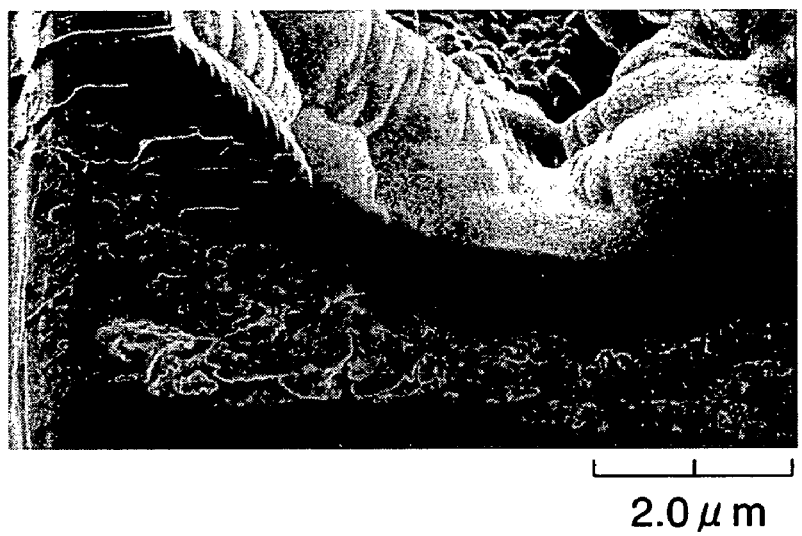
FIGS. 15A and 15B are views each showing an experiment and a result thereof.
Figure 15B:
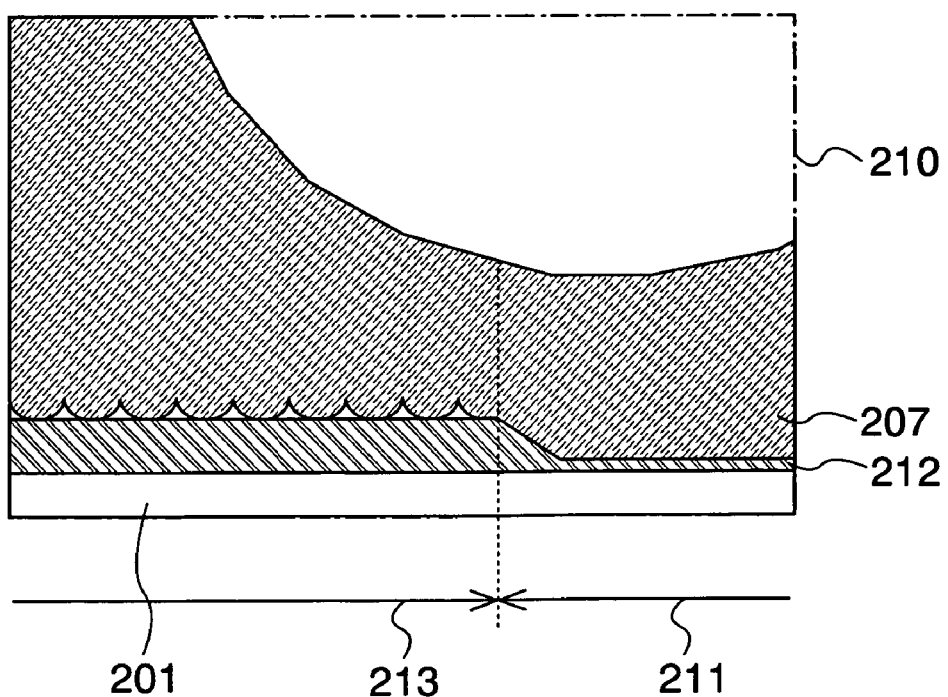
Figure 16A:
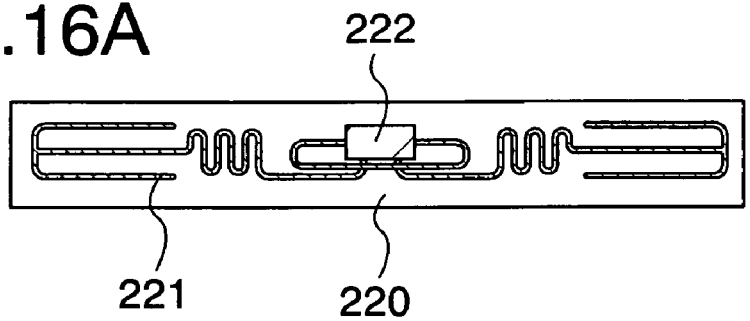
FIGS. 16A to 16D are views each showing a semiconductor device of the present invention.
Figure 16B:
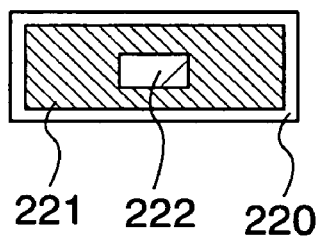
Figure 16C:
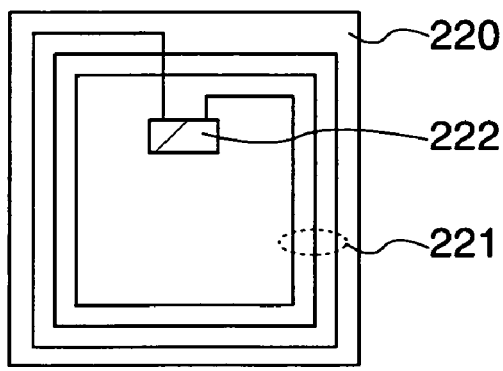
Figure 16D:
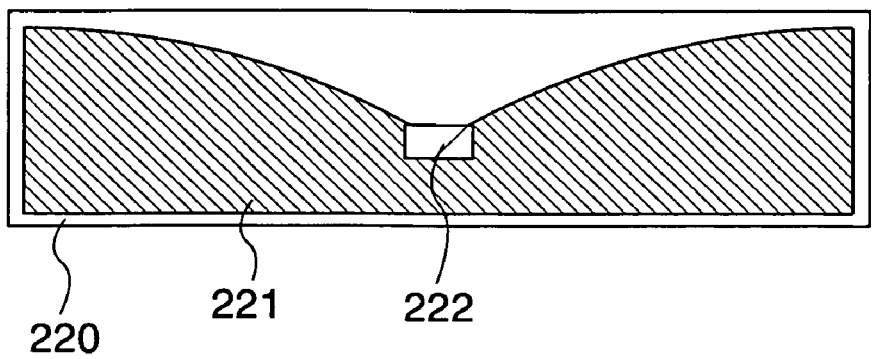

FIG. 15A is an FIB (Focused Ion Beam System) image of a region 210 of FIG. 14C. FIG. 15B is a schematic view of FIG. 15A, and in FIG. 15B, a conductive layer 212 corresponds to the stacked body of the first conductive layer 202 to the fifth conductive layer 206. As the result of observing the cross section of the sample C, a portion where the fifth conductive layer 206 and the sixth conductive layer 207 are in contact with each other was increased by the laser beam irradiation. In addition, part of the third conductive layer 204, part of the fourth conductive layer 205, and part of the fifth conductive layer 206 were dissolved by the laser beam irradiation; thus, a portion 209 where the third conductive layer 204 and the sixth conductive layer 207 are in contact with each other was formed. In such a manner, portions where the stacked body of the first conductive layer 202 to the fifth conductive layer 206 and the sixth conductive layer 207 are in contact with each other could be increased by the laser beam irradiation. Therefore, the resistance value between the stacked body of the first conductive layer 202 to the fifth conductive layer 206 and the sixth conductive layer 207 could be reduced.

This application is based on Japanese Patent Application serial No. 2005-235017 filed in Japan Patent Office on Aug. 12, 2005 the entire contents of which are hereby incorporated by reference.

EXPLANATION OF REFERENCE 10. substrate, 11. insulating layer, 12. peeling layer, 13. insulating layer, 14. plurality of transistors, 15. insulating layer, 16. insulating layer, 17. insulating layer, 18. conductive layer, 19. conductive layer, 20. conductive layer, 21. conductive layer, 22. conductive layer, 23. conductive layer, 24. conductive layer, 25. conductive layer, 26. conductive layer, 27. conductive layer, 28. insulating layer, 29. opening, 30. opening, 31. opening, 32. insulating layer, 33. insulating layer, 34. conductive layer, 35. conductive layer, 36. opening, 37. substrate, 38. conductive layer, 39. conductive layer, 40. anisotropic conductive layer, 41. substrate, 42. substrate, 43. adhesive layer, 44. adhesive layer, 45. antenna, 46. capacitor element, 47. protective layer, 48. substrate, 49. substrate, 50. semiconductor layer, 51. insulating layer, 52. conductive layer, 53. impurity region, 54. impurity region, 55. channel forming region, 100. semiconductor device, 101. arithmetic processing circuit, 103. memory circuit, 104. antenna, 109. power supply circuit, 110. demodulation circuit, 111. modulation circuit, 112. reader/writer, 121. reader/writer, 122. computer, 125. semiconductor device, 201. substrate, 202. first conductive layer, 203. second conductive layer, 204. third conductive layer, 205. fourth conductive layer, 206. fifth conductive layer, 207. sixth conductive layer, 208. portion, 209. portion, 210. region, 211. region, 212. conductive layer, 213. region, 221. substrate, 222. first conductive layer, 223. second conductive layer, 224. third conductive layer, 225. fourth conductive layer, 226. fifth conductive layer, 227. sixth conductive layer, 228. sixth conductive layer, 229. sixth conductive layer, 230. sixth conductive layer, 240. substrate, 241. conductive layer, 242. stacked body including plurality of transistors, 251. insulating layer, 252. layer containing conductive material; 253. insulating layer, 254. hydrophilic layer, 255. insulating layer mixed with conductive material, 256. insulating layer, 257. layer containing antistatic agent, and 258. insulating layer mixed with antistatic agent.

The invention claimed is:

1. A method for manufacturing a semiconductor device comprising the steps of:
   forming a peeling layer over a substrate;
   forming a first insulating layer over the peeling layer;
   forming a transistor over the first insulating layer;
   forming a second insulating layer over the transistor;
   forming a first conductive layer connected to a source or a drain of the transistor through an opening provided in the second insulating layer;
   forming a second conductive layer containing a conductive particle and resin over the first conductive layer;
   increasing an area where the first conductive layer and the second conductive layer are in contact with each other by irradiating the second conductive layer with a laser beam;
   selectively forming a third insulating layer so as to expose part of the second conductive layer over the second insulating layer and the second conductive layer;
   forming such an opening that the peeling layer is exposed by irradiating the second insulating layer and the third insulating layer with a laser beam; and
   separating a stacked body including the transistor from the substrate by using the inside of the peeling layer or the interface between the peeling layer and the first insulating layer as a boundary.

2. A method for manufacturing a semiconductor device according to claim 1, wherein, as the first conductive layer, a layer containing titanium, tungsten, chromium, aluminum, tantalum, nickel, zirconium, hafnium, vanadium, iridium, niobium, lead, platinum, molybdenum, cobalt, or rhodium is formed.

3. A method for manufacturing a semiconductor device according to claim 1, wherein the first conductive layer is formed by a sputtering method.

4. A method for manufacturing a semiconductor device according to claim 1, wherein the second conductive layer is formed by a screen printing method.

5. A method for manufacturing a semiconductor device according to claim 1, wherein the conductive particle is gold, silver, or copper.

6. A method for manufacturing a semiconductor device according to claim 1, wherein, as the peeling layer, a layer containing tungsten is formed.

7. A method for manufacturing a semiconductor device comprising the steps of:
   forming a peeling layer over a first substrate;
   forming a first insulating layer over the peeling layer;
   forming a transistor over the first insulating layer;
   forming a second insulating layer over the transistor;
   forming a first conductive layer connected to a source or a drain of the transistor through an opening provided in the second insulating layer;
   forming a second conductive layer containing a conductive particle and resin so as to be in contact with the first conductive layer;
   increasing an area where the first conductive layer and the second conductive layer are in contact with each other by irradiating the second conductive layer with a laser beam;
   selectively forming a third insulating layer so as to expose part of the second conductive layer over the second insulating layer and the second conductive layer;
   forming such an opening that the peeling layer is exposed by irradiating the second insulating layer and the third insulating layer with a laser beam;
   with the use of a second substrate provided over a surface of the third insulating layer, separating a stacked body including the transistor from the first substrate by using the inside of the peeling layer or the interface between the peeling layer and the first insulating layer as a boundary;
   separating the second substrate from a surface of the second insulating layer along with providing a third substrate over a surface of the first insulating layer;
   forming a third conductive layer connected to the second conductive layer through an opening provided in the third insulating layer; and
   providing a fourth substrate over the third insulating layer so as to electrically connect to each other the third conductive layer and a fourth conductive layer over the fourth substrate.

8. A method for manufacturing a semiconductor device according to claim 7, wherein, as the first conductive layer, a layer containing titanium, tungsten, chromium, aluminum, tantalum, nickel, zirconium, hafnium, vanadium, iridium, niobium, lead, platinum, molybdenum, cobalt, or rhodium is formed.

9. A method for manufacturing a semiconductor device according to claim 7, wherein the first conductive layer is formed by a sputtering method.

10. A method for manufacturing a semiconductor device according to claim 7, wherein the second conductive layer is formed by a screen printing method.

11. A method for manufacturing a semiconductor device according to claim 7, wherein the conductive particle is gold, silver, or copper.

12. A method for manufacturing a semiconductor device according to claim 7, wherein, as the peeling layer, a layer containing tungsten is formed.

* * * * *